US009761737B2

(12) United States Patent
Tanaka

(10) Patent No.: US 9,761,737 B2
(45) Date of Patent: Sep. 12, 2017

(54) SEMICONDUCTOR DEVICE

(71) Applicant: Semiconductor Energy Laboratory Co., Ltd., Kanagawa-ken (JP)

(72) Inventor: Tetsuhiro Tanaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/264,823

(22) Filed: Apr. 29, 2014

(65) Prior Publication Data
US 2014/0326994 A1    Nov. 6, 2014

(30) Foreign Application Priority Data

May 1, 2013  (JP) .................................. 2013-096364

(51) Int. Cl.
*H01L 29/786*    (2006.01)
*H01L 29/45*    (2006.01)

(52) U.S. Cl.
CPC ........ *H01L 29/78696* (2013.01); *H01L 29/45* (2013.01); *H01L 29/7869* (2013.01); *H01L 29/78618* (2013.01)

(58) Field of Classification Search
CPC ....................... H01L 29/7869; H01L 29/78696
(Continued)

(56) References Cited

U.S. PATENT DOCUMENTS 4,902,637 A    2/1990    Kondou et al.
5,731,856 A    3/1998    Kim et al.
(Continued)

FOREIGN PATENT DOCUMENTS

CN    101910450 A    12/2010
CN    102569402 A    7/2012
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Jerome Jackson, Jr.
*Assistant Examiner* — David Spalla
(74) *Attorney, Agent, or Firm* — Husch Blackwell LLP

(57) ABSTRACT

A highly reliable semiconductor device which uses an oxide semiconductor and in which a change in the electrical characteristics is suppressed is provided. The semiconductor device includes an island-shaped semiconductor layer over a base insulating layer, a pair of electrodes over the semiconductor layer, a barrier layer in contact with undersurfaces of the electrodes, a gate electrode over the semiconductor layer, and a gate insulating layer between the semiconductor layer and the gate electrode. The semiconductor layer contains an oxide semiconductor. The base insulating layer contains silicon oxide or silicon oxynitride. The electrodes each contain Al, Cr, Cu, Ta, Ti, Mo, or W. The barrier layer contains oxide containing one or more metal elements contained in the oxide semiconductor. Furthermore, the electrodes and the barrier layer extend to the outside of the semiconductor layer when seen from above.

23 Claims, 9 Drawing Sheets

(58) Field of Classification Search
USPC .......................................................... 257/43
See application file for complete search history.

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,663,165 B2 | 2/2010 | Mouli | |
| 7,674,650 B2 | 3/2010 | Akimoto et al. | |
| 7,732,819 B2 | 6/2010 | Akimoto et al. | |
| 8,049,225 B2 | 11/2011 | Yamazaki et al. | |
| 8,624,237 B2 | 1/2014 | Yamazaki et al. | |
| 8,785,242 B2 | 7/2014 | Yamazaki et al. | |
| 8,841,662 B2 * | 9/2014 | Yamazaki ............ H01L 29/7869 257/43 | |
| 9,105,659 B2 | 8/2015 | Yamazaki et al. | |
| 9,202,546 B2 | 12/2015 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0057672 A1* | 3/2009 | Kobayashi ............... H01L 29/04 257/59 | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0114918 A1 | 5/2009 | Wang et al. | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0025678 A1* | 2/2010 | Yamazaki ........... H01L 27/1225 257/43 | |
| 2010/0051949 A1 | 3/2010 | Yamazaki et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0163868 A1 | 7/2010 | Yamazaki et al. | |
| 2011/0089417 A1 | 4/2011 | Yamazaki et al. | |
| 2011/0101351 A1 | 5/2011 | Yamazaki | |
| 2011/0306165 A1 | 12/2011 | Ikisawa et al. | |
| 2012/0001169 A1* | 1/2012 | Yamazaki ............... H01L 29/45 257/43 | |
| 2012/0161132 A1 | 6/2012 | Yamazaki | |
| 2012/0273780 A1 | 11/2012 | Yamazaki et al. | |
| 2012/0288993 A1* | 11/2012 | Sasagawa ........... H01L 27/1225 438/104 | |
| 2013/0140554 A1* | 6/2013 | Yamazaki ............. H01L 29/786 257/43 | |
| 2013/0299818 A1* | 11/2013 | Tanaka .................... H01L 29/78 257/43 | |
| 2014/0167041 A1 | 6/2014 | Yamazaki et al. | |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| | | |
|---|---|---|
| JP | 2004-273732 A | 9/2004 |
| JP | 2007-096055 A | 4/2007 |
| JP | 2007-123861 A | 5/2007 |
| JP | 2010-186860 A | 8/2010 |
| JP | 2012-064923 A | 3/2012 |
| JP | 2012-151453 A | 8/2012 |
| KR | 2010-0094597 A | 8/2010 |
| KR | 2012-0075423 A | 7/2012 |
| KR | 2013-0030295 A | 3/2013 |
| TW | 200936792 | 9/2009 |
| TW | 201205815 | 2/2012 |
| TW | 201240081 | 10/2012 |
| WO | WO-2004/114391 | 12/2004 |
| WO | WO 2009/084537 A1 | 7/2009 |
| WO | WO 2010/093051 A1 | 8/2010 |
| WO | WO 2012/002471 A1 | 1/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165020-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Compositions for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350° C", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductors", Science, May 23, 2003, vol. 300, No. 5623, pp. 1269-1272.
Nowatari.H et al., "60.2: Intermediate Connector With Suppressed Voltage Loss for White Tandel OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)m$ (m<4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Tehnical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report re Application No. PCT/JP2014/061645, dated Jul. 22, 2014.
Written Opinion re Application No. PCT/JP2014/061645, dated Jul. 22, 2014.

\* cited by examiner 101  106  110  102  104  105  103  107

101  106  110  161  102  162  105  104  103  107

SEMICONDUCTOR DEVICE

TECHNICAL FIELD

The present invention relates to a semiconductor device.

In this specification and the like, a semiconductor device means all types of devices that can function by utilizing semiconductor characteristics; a transistor; a semiconductor circuit, an arithmetic unit, a memory device, an imaging device, an electro-optical device, a power generation device (e.g., a thin film solar cell and an organic thin film solar cell), an electronic device, and the like are each an embodiment of the semiconductor device.

BACKGROUND ART

Attention has been focused on a technique for formation of a transistor using a semiconductor thin film formed over a substrate having an insulating surface. The transistor is applied to a wide range of electronic devices such as an integrated circuit (IC) or an image display device (also simply referred to as a display device). A silicon-based semiconductor material is widely known as a material for a semiconductor thin film applicable to a transistor. As another material, an oxide semiconductor has been attracting attention.

For example, a technique for formation of a transistor using zinc oxide or an In—Ga—Zn-based oxide semiconductor as an oxide semiconductor is disclosed (see Patent Documents 1 and 2).

REFERENCE

Patent Document

[Patent Document 1] Japanese Published Patent Application No. 2007-123861

[Patent Document 2] Japanese Published Patent Application No. 2007-096055

DISCLOSURE OF INVENTION

An object of one embodiment of the present invention is to obtain a semiconductor device using an oxide semiconductor, which has favorable electrical characteristics.

Another object is to provide a highly reliable semiconductor device which uses an oxide semiconductor and in which a change in the electrical characteristics is suppressed.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including an island-shaped semiconductor layer over a base insulating layer, a pair of electrodes over the semiconductor layer, a barrier layer in contact with undersurfaces of the electrodes, a gate electrode over the semiconductor layer, and a gate insulating layer between the semiconductor layer and the gate electrode. The semiconductor layer contains an oxide semiconductor. The base insulating layer contains silicon oxide or silicon oxynitride. The electrodes each contain Al, Cr, Cu, Ta, Ti, Mo, or W. The barrier layer contains oxide containing one or more metal elements contained in the oxide semiconductor. Furthermore, the electrodes and the barrier layer extend to the outside of the semiconductor layer when seen from above.

It is preferable that the shapes of the electrodes and the shape of the barrier layer substantially are aligned with each other when seen from above.

Over the base insulating layer, at least in a region which does not overlap with the barrier layer nor the semiconductor layer, an insulating layer containing silicon nitride, silicon nitride oxide, aluminum oxide, aluminum oxynitride, gallium oxide, gallium oxynitride, yttrium oxide, yttrium oxynitride, hafnium oxide, or hafnium oxynitride is preferably provided.

The semiconductor layer preferably contains an In—M—Zn-based oxide (M is Al, Ti, Ga, Y, Zr, La, Ce, Nd, or Hf).

Alternatively, it is preferable that the semiconductor layer and the barrier layer each contain an In—M—Zn-based oxide (M is Al, Ti, Ga, Y, Zr, La, Ce, Nd, or Hf), and the barrier layer have an In content higher than that of the semiconductor layer.

The barrier layer may contain an In—M—Zn-based oxide (M is Al, Ti, Ga, Y, Zr, La, Ce, Nd, or Hf), and an M content may be lower than or equal to the In content in the barrier layer. In addition, in the barrier layer, the sum of the M content and a Zn content may be lower than or equal to the In content.

The barrier layer preferably has a thickness greater than or equal to 3 nm and less than or equal to 100 nm.

The semiconductor layer preferably includes a plurality of crystal parts. It is preferable that c-axes of the plurality of crystal parts be aligned perpendicular to a top surface of the base insulating layer or a top surface of the semiconductor layer and two of the plurality of crystal parts that are adjacent to each other have no grain boundary.

The barrier layer preferably includes a plurality of crystal parts. It is preferable that c-axes of the plurality of crystal parts be aligned perpendicular to the top surface of the base insulating layer, the top surface of the semiconductor layer, and a top surface of the barrier layer and two of the plurality of crystal parts that are adjacent to each other have no grain boundary.

In addition, a transistor in which a channel is formed in silicon, germanium, silicon germanium, silicon carbide, or gallium arsenide may be provided below the base insulating layer. In this case, between the transistor and the base insulating layer, a first insulating layer containing silicon nitride, silicon nitride oxide, aluminum oxide, aluminum oxynitride, gallium oxide, gallium oxynitride, yttrium oxide, yttrium oxynitride, hafnium oxide, or hafnium oxynitride is preferably provided. Furthermore, in this case, it is preferable that a connection wiring be provided between the base insulating layer and the transistor, an opening be provided in a region in the base insulating layer that overlaps with the connection wiring, and the barrier layer be provided in contact with side surfaces of the opening and a top surface of the connection wiring that is under the opening.

Note that in this specification and the like, the content of a specified element contained in a compound is expressed by an atomic ratio unless otherwise described. The atomic ratio has an error of ±20%.

Note that in this specification and the like, the expression "shapes substantially aligned with each other when seen from above" means that at least outlines of stacked layers partly overlap with each other. For example, the case of patterning or partly patterning an upper layer and a lower layer with the use of the same mask pattern is included in the expression. The expression "shapes substantially aligned with each other when seen from above" includes the case where the outlines do not completely overlap with each other; for example, an end portion of an upper layer may be positioned on an inner side than an end portion of a lower layer, or may be positioned on an outer side than the end portion of the lower layer.

One embodiment of the present invention makes it possible to provide a semiconductor device having favorable electrical characteristics. Further, one embodiment of the present invention makes it possible to provide a highly reliable semiconductor device in which a change in the electrical characteristics is suppressed.

BEST MODE FOR CARRYING OUT THE INVENTION

Figure 1A:
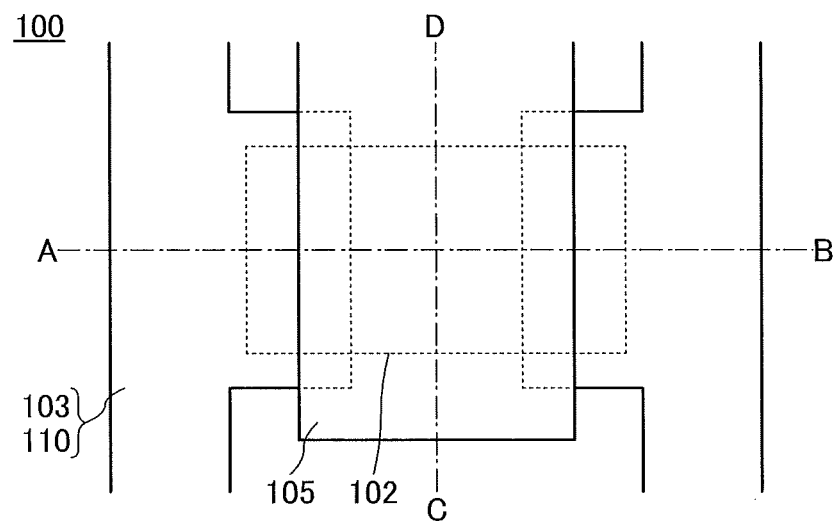
FIGS. 1A to 1C illustrate an example of a structure of a semiconductor device of an embodiment.

Embodiments will be described in detail with reference to drawings. Note that the present invention is not limited to the description below, and it is easily understood by those skilled in the art that various changes and modifications can be made without departing from the spirit and scope of the present invention. Therefore, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT) in its category.

(Embodiment 1)

In this embodiment, examples of a structure of a transistor as a semiconductor device, which is one embodiment of the present invention, and an example of a method for manufacturing the transistor are described with reference to drawings.

In the case of forming a transistor using an oxide semiconductor, an oxygen vacancy can be given as a carrier supply source of the oxide semiconductor. A large number of oxygen vacancies in an oxide semiconductor including a channel formation region of a transistor lead to generation of electrons that are carriers in the channel formation region, which causes defects in electrical characteristics; for example, threshold voltage of the transistor varies, leakage current increases, or the threshold voltage changes due to stress application.

Thus, to obtain stable electrical characteristics of a semiconductor device using an oxide semiconductor, some measures need to be taken to reduce oxygen vacancies in the oxide semiconductor.

In view of the foregoing, oxygen is supplied from a base insulating layer provided below an oxide semiconductor layer to a channel formation region in a semiconductor device of one embodiment of the present invention, whereby oxygen vacancies which might be generated in the channel formation region are filled.

Here, when an electrode included in the transistor is provided in contact with the base insulating layer or over the base insulating layer with a layer through which oxygen passes provided therebetween, part of oxygen released from the base insulating layer is diffused into the electrode, which might result in a reduction in the amount of oxygen supplied to the channel formation region.

For this reason, in the semiconductor device of one embodiment of the present invention, a barrier layer that inhibits permeation of oxygen is provided between the base insulating layer and the electrode included in the transistor to prevent diffusion of oxygen released from the base insulating layer into the electrode. Consequently, an adequate amount of oxygen can be supplied from the base insulating layer to the channel formation region, which makes it possible to provide a highly reliable semiconductor device which has favorable electrical characteristics and in which a change in the electrical characteristics is suppressed.

More specifically, the following structures can be employed for example.

[Example of Structure]

Figure 1B:
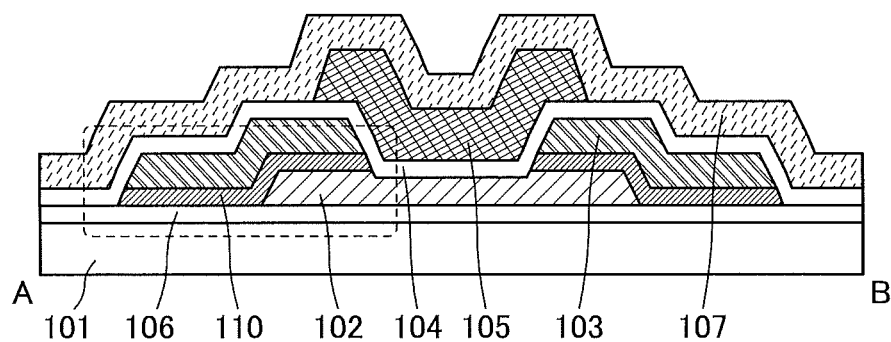
Figure 1C:
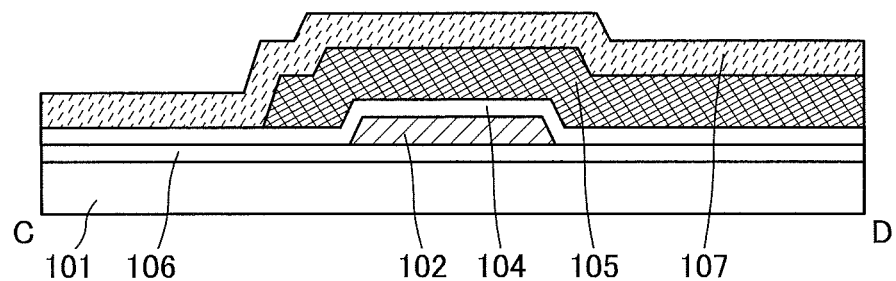

FIG. 1A is a schematic top view of a transistor 100 described as an example of the structure. FIG. 1B is a schematic cross-sectional view taken along line A-B in FIG. 1A and FIG. 1C is a schematic cross-sectional view along line C-D in FIG. 1A. Note that some components are not illustrated in FIG. 1A for simplicity.

The transistor 100 is provided over a substrate 101 and includes an island-shaped semiconductor layer 102, a pair of electrodes 103 that partly overlaps with the semiconductor layer 102, a barrier layer 110 provided in contact with undersurfaces of the electrodes 103, a gate electrode 105 that overlaps with the semiconductor layer 102, and a gate insulating layer 104 provided between the semiconductor layer 102 and the gate electrode 105.

A base insulating layer 106 is provided to cover a top surface of the substrate 101. The base insulating layer 106 is provided in contact with an undersurface of the semiconductor layer 102.

An insulating layer 107 is provided to cover the transistor 100. Specifically, the insulating layer 107 is provided over the gate insulating layer 104, the pair of electrodes 103, and the gate electrode 105.

The semiconductor layer 102 contains an oxide semiconductor. The semiconductor layer 102 preferably contains at least indium (In) or zinc (Zn). Alternatively, both In and Zn are preferably contained. The semiconductor layer 102 more preferably contains an In—M—Zn-based oxide (M is a metal such as Al, Ti, Ga, Ge, Y, Zr, Sn, La, Ce, or Hf).

The barrier layer 110 contains an oxide including at least one or more metal elements contained in the oxide semiconductor contained in the semiconductor layer 102. For example, In or Zn is contained. Alternatively, the barrier layer 110 contains preferably both In and Zn, more preferably an In—M—Zn-based oxide (M is a metal such as Al, Ti, Ga, Ge, Y, Zr, Sn, La, Ce, or Hf).

In the case where the barrier layer 110 contains the In—M—Zn-based oxide, an M content is preferably lower than or equal to an In content in the barrier layer 110. Specifically, given that metal elements are contained in the barrier layer 110 in a ratio of In:M:Zn=x:y:z, an oxide satisfying the equation x=y or the inequality x>y is preferably contained.

Alternatively, the barrier layer 110 preferably contains an oxide such that the sum of the M content and a Zn content may be lower than or equal to the In content in the barrier layer 110. Specifically, an oxide satisfying the equation x=(y+z) or the inequality x>(y+z) is preferably contained. The use of a material with a high In content for the barrier layer 110 can reduce parasitic capacitance between the semiconductor layer 102 and the electrodes 103 which are electrically connected to each other with the barrier layer 110 provided therebetween.

For example, in the case of using an In—Ga—Zn-based oxide for the barrier layer 110, the atomic ratio of In to Ga and Zn can be 1:1:1, 2:2:1, 4:2:3, 3:1:2, 8:4:3, 3:1:1, or the like in the In—Ga—Zn-based oxide. Note that the atomic ratio has an error of ±20%.

In the case where both the semiconductor layer 102 and the barrier layer 110 contain an In—M—Zn-based oxide, materials thereof are preferably selected so that the In content of the barrier layer 110 is higher than that of the semiconductor layer 102. The use of a material with an In content higher than that of the semiconductor layer 102 for the barrier layer 110 can reduce the above-described parasitic capacitance more effectively.

The barrier layer 110 has a thickness greater than or equal to 1 nm and less than or equal to 200 nm, preferably greater than or equal to 3 nm and less than or equal to 100 nm. The thicker the barrier layer 110 is, the more a barrier property to oxygen described later can be improved. However, a too thick barrier layer (e.g., a barrier layer with a thickness larger than 200 nm) takes long time to be formed, leading to a reduction in productivity. The thickness of the barrier layer 110 is determined in accordance with the material and formation method thereof or the physical property thereof such as density. A sufficient battier property to oxygen can be ensured as long as the thickness of the barrier layer 110 is greater than or equal to 1 nm, preferably greater than or equal to 3 nm.

One of the pair of electrodes 103 serves as a source electrode of the transistor 100 and the other serves as a drain electrode of the transistor 100.

A conductive material which is easily bonded to oxygen can be used for at least part of the pair of electrodes 103 that is in contact with the barrier layer 110. Examples of such a conductive material include Al, Cr, Cu, Ta, Ti, Mo, and W. Alternatively, nitride of any of these conductive materials may be used. The use of W or Ti with relatively high melting point can raise the upper limit of the temperature in the manufacturing process of the transistor 100, which is preferable. Note that the conductive material which is easily bonded to oxygen includes, in its category, a material into which oxygen is easily diffused.

When such a conductive material and oxide are in contact with each other, oxygen in the oxide is partly diffused into the conductive material. Furthermore, when the conductive material and the oxide in contact with each other are heated, oxygen is further diffused into the conductive material. Due to such migration of oxygen, oxygen vacancies are generated in a region in the vicinity of the interface between the barrier layer 110 and the electrodes 103 or entirely in the barrier layer 110, so that such regions have n-type conductivity; thus, the resistance of the barrier layer 110 is reduced. The low-resistance barrier layer 110 sandwiched between the semiconductor layer 102 and the electrodes 103 can serve as a source and a drain of the transistor 100, for example. Being provided in contact with the undersurfaces of the electrodes 103, the low-resistance barrier layer 110 can serve as part of the electrodes 103.

Here, it is preferable that the pair of electrodes 103 and the barrier layer 110 be processed with the use of the same photomask, and shapes thereof be substantially aligned with each other when seen from above. Such a structure only requires addition of a step of forming a film serving as the barrier layer 110 in the manufacturing process of the transistor 100 to introduce the barrier layer 110, and preparation of another photomask is not needed; therefore, a highly reliable transistor can be provided while reducing influence on productivity.

For the base insulating layer 106, an insulating material containing oxide is used. An insulating material from which oxygen is partly released due to heating is preferably used for the base insulating layer 106. For example, a material containing silicon oxide or silicon oxynitride is preferably used. Note that in this specification, a "silicon oxynitride film" refers to a film that contains more oxygen than nitrogen, and the "silicon nitride oxide film" refers to a film that contains more nitrogen than oxygen.

Figure 2A:
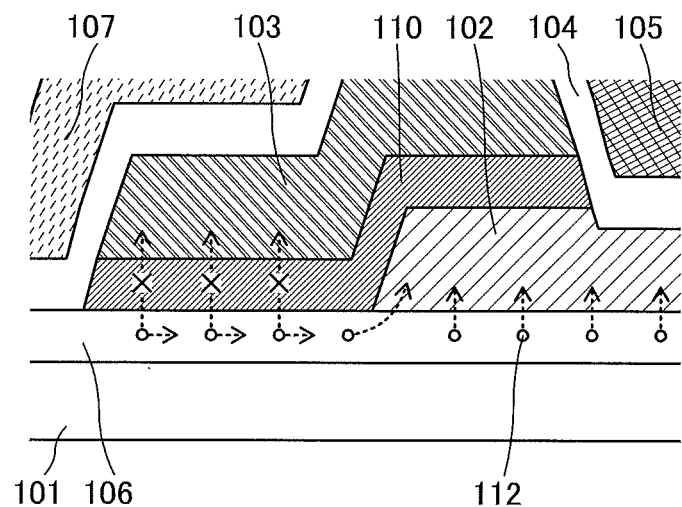
FIGS. 2A and 2B each illustrate an example of a structure of a semiconductor device of an embodiment.
Figure 2B:
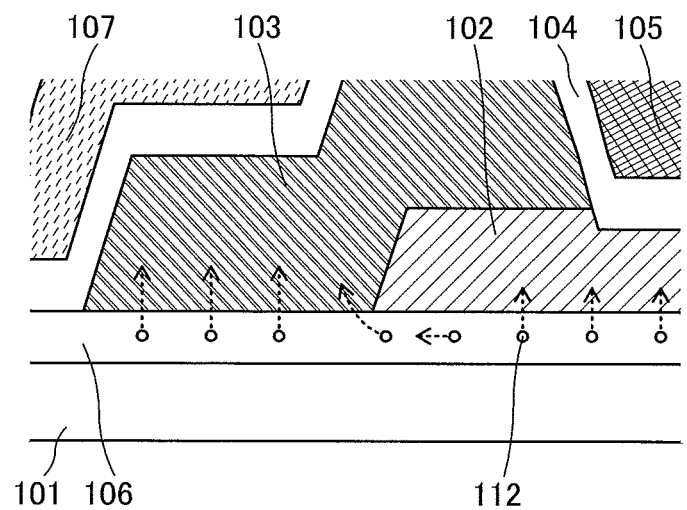

Here, an effect of the barrier layer 110 is described with reference to FIGS. 2A and 2B. FIG. 2A schematically illustrates an enlarged view of a region surrounded by the dashed line in FIG. 1B. FIG. 2B illustrates the case where the barrier layer 110 is not provided.

In FIGS. 2A and 2B, oxygen 112 released from the base insulating layer 106 is schematically illustrated by circles, and directions of oxygen diffusion are schematically illustrated by arrows. Here, the case is considered in which the oxygen 112 in the base insulating layer 106 is easily diffused due to heating or the like.

As illustrated in FIG. 2A, in a region overlapping with the semiconductor layer 102, the oxygen 112 is released from the base insulating layer 106 and supplied to the semiconductor layer 102. On the other hand, the oxygen 112 hardly passes through the barrier layer 110; thus, in a region where the barrier layer 110 and the base insulating layer 106 are in contact with each other, the oxygen 112 in the base insulating layer 106 is hardly diffused into an upper layer. For this reason, a concentration gradient is formed in the base insulating layer 106. In the concentration gradient, the closer the region overlapping with the semiconductor layer 102 is, the lower the concentration of oxygen is. As a result, the oxygen 112 in the base insulating layer 106 is diffused toward a region with low oxygen concentration, i.e., the region overlapping with the semiconductor layer 102, and part of the oxygen 112 is further diffused into the semiconductor layer 102.

On the other hand, as illustrated in FIG. 2B, in the case where the barrier layer 110 is not provided, the base insulating layer 106 and the electrodes 103 are in contact with each other; therefore, the oxygen 112 in the base insulating layer 106 is diffused into the electrodes 103. Furthermore, since the semiconductor layer 102 contains oxide and has oxygen concentration higher than that of the electrodes 103, the oxygen 112 in the base insulating layer 106 tends to be diffused into the electrodes 103. For this reason, a concentration gradient of oxygen is formed in the base insulating layer 106. That is, in the base insulating layer 106, the oxygen concentration of the region in contact with the electrodes 103 is lower than that of the region overlapping with the semiconductor layer 102, and the oxygen 112 is diffused toward the region in contact with the electrodes 103 in accordance with the concentration gradient. As a result, the amount of the oxygen 112 supplied to the semiconductor layer. 102 is reduced.

As described above, the barrier layer 110 provided between the electrodes 103 and the base insulating layer 106 can inhibit diffusion of oxygen from the base insulating layer 106 to the electrodes 103 effectively, resulting in an increase in the amount of oxygen supplied from the base insulating layer 106 to the semiconductor layer 102. Consequently, oxygen vacancies in the semiconductor layer 102 are reduced, which makes it possible to provide the highly reliable transistor 100 which has favorable electrical characteristics and in which a change in the electrical characteristics is suppressed.

The insulating layer 107 in FIGS. 1A to 1C preferably contains a material relatively impermeable to oxygen. It is preferable that the insulating layer 107 be provided at least over the base insulating layer 106 to cover a region where the barrier layer 110 and the semiconductor layer 102 are not provided. By providing the insulating layer 107 which is relatively impermeable to oxygen over a region where the barrier layer 110 is not provided, oxygen released from the base insulating layer 106 can be inhibited from releasing upward in the region; therefore, the amount of oxygen supplied to the semiconductor layer 102 in contact with the top surface of the base insulating layer 106 can be increased.

As the material relatively impermeable to oxygen, which can be used for the insulating layer 107, an insulating material such as silicon nitride, silicon nitride oxide, aluminum oxide, aluminum oxynitride, gallium oxide, gallium oxynitride, yttrium oxide, yttrium oxynitride, hafnium oxide, or hafnium oxynitride can be used.

[Components]

Components of the transistor 100 are described below.

[Semiconductor Layer and Barrier Layer]

An oxide semiconductor having a wider band gap and lower carrier density than silicon is preferably used in the semiconductor layer 102 because off-state current of the transistor can be reduced.

As a semiconductor used for the semiconductor layer 102 and the barrier layer 110, an amorphous semiconductor or a semiconductor having crystallinity (a microcrystalline semiconductor, a polycrystalline semiconductor, a single crystal semiconductor, a semiconductor partly including crystal parts, or a semiconductor including crystal parts in the whole area) may be used. A semiconductor having crystallinity is preferably used for the semiconductor layer 102, in which case deterioration of transistor characteristics can be reduced.

As the semiconductor layer 102, it is particularly preferable to use a layer including a plurality of crystal parts whose c-axes are aligned perpendicular to a surface on which the semiconductor layer 102 is formed (i.e., the top surface of the base insulating layer 106) or a top surface of the semiconductor layer 102 and in which the adjacent crystal parts have no grain boundary.

As the barrier layer 110, it is also preferable to use a layer that includes a plurality of crystal parts whose c-axes are aligned perpendicular to a surface on which the barrier layer 110 is formed (i.e., the top surface of the base insulating layer 106 or the top surface of the semiconductor layer 102) or a top surface of the barrier layer 110 and in which the adjacent crystal parts have no grain boundary.

The use of such materials for the semiconductor layer 102 and the barrier layer 110 makes it possible to provide a highly reliable transistor 100 in which a change in the electrical characteristics is suppressed.

In particular, diffusion of oxygen through grain boundaries can be prevented because a material in which adjacent crystal parts have no grain boundary is used for the barrier layer 110, resulting in an increase in a barrier property to oxygen.

Note that details of a preferable mode and a formation method of an oxide semiconductor applicable to the semiconductor layer 102 and the barrier layer 110 are described in an embodiment below.

[Substrate]

There is no particular limitation on the property of a material and the like of the substrate 101 as long as the material has heat resistance enough to withstand at least heat treatment in the process. For example, a glass substrate, a ceramic substrate, a quartz substrate, a sapphire substrate, or an yttria-stabilized zirconia (YSZ) substrate may be used as the substrate 101. Alternatively, a single crystal semiconductor substrate or a polycrystalline semiconductor substrate made of silicon or silicon carbide, a compound semiconductor substrate made of silicon germanium or the like, an SOI substrate, or the like can be used.

Still alternatively, any of the above-described semiconductor substrates or the SOI substrate provided with a semiconductor element may be used as the substrate 101. In this case, the transistor 100 is formed over the substrate 101 with an interlayer insulating layer provided therebetween. The transistor 100 in this case may have a structure in which at least one of the gate electrode 105 and the pair of electrodes 103 is electrically connected to the above semiconductor element by a connection electrode embedded in the interlayer insulating layer. Forming the transistor 100 over the semiconductor element with the interlayer insulating layer interposed therebetween can suppress an increase in area due to the formation of the transistor 100.

Still alternatively, a flexible substrate such as a plastic substrate may be used as the substrate 101, and the transistor 100 may be provided directly on the flexible substrate. Further alternatively, a separation layer may be provided between the substrate 101 and the transistor 100. The separation layer can be used when part or the whole of the transistor is formed over the separation layer, separated from the substrate 101, and transferred to another substrate. Thus, the transistor 100 can be transferred to a substrate having low heat resistance or a flexible substrate.

[Gate Electrode]

The gate electrode 105 can be formed using a metal selected from aluminum, chromium, copper, tantalum, titanium, molybdenum, and tungsten; an alloy containing any of these metals as a component; an alloy containing any of these metals in combination; or the like. Further, one or both of manganese and zirconium may be used. Alternatively, a semiconductor typified by polycrystalline silicon doped with an impurity element such as phosphorus, or a silicide such as nickel silicide may be used for the gate electrode 105. Furthermore, the gate electrode 105 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Still alternatively, an alloy film or a nitride film which contains aluminum and one or more metals selected from titanium, tantalum, tungsten, molybdenum, chromium, neodymium, and scandium may be used.

Still alternatively, the gate electrode 105 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

An In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 105 and the gate insulating layer 104. These films each have a work function of 5 eV or higher, preferably 5.5 eV or higher, which is higher than the electron affinity of an oxide semiconductor; thus, the threshold voltage of a transistor including the oxide semiconductor can be shifted in the positive direction. Accordingly, a switching element having what is called normally-off characteristics is obtained. For example, as an In—Ga—Zn-based oxynitride semiconductor film, an In—Ga—Zn-based oxynitride semiconductor film having a higher nitrogen concentration than at least the semiconductor layer 102, specifically an In—Ga—Zn-based oxynitride semiconductor film having a nitrogen concentration higher than or equal to 7 at.%, is used.

[Gate Insulating Layer]

The gate insulating layer 104 can be formed to have a single-layer structure or a stacked-layer structure using, for example, one or more of silicon oxide, silicon oxynitride, silicon nitride oxide, aluminum oxide, hafnium oxide, gallium oxide, Ga—Zn-based metal oxide, silicon nitride, and the like.

Alternatively, the gate insulating layer 104 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, in which case gate leakage current of the transistor can be reduced.

[Pair of Electrodes]

The above-described conductive material which is easily bonded to oxygen may be used for at least part of the pair of electrodes 103 that is in contact with the barrier layer 110. Alternatively, a stacked-layer structure in which another conductive material is stacked over the above-described conductive material may be used. For example, a conductive material of nickel, yttrium, zirconium, silver, or the like, nitride of the conductive material, or a transparent conductive material containing indium oxide, tin oxide, or zinc oxide may be used. Still alternatively, a stacked-layer structure of two or more layers formed of the conductive material which is easily bonded to oxygen can be used.

For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given.

[Base Insulating Layer]

The base insulating layer 106 may have a function of preventing diffusion of impurities contained in the substrate 101 in addition to a function of supplying oxygen to the semiconductor layer 102.

The base insulating layer 106 is preferably formed using an oxide insulating film containing oxygen at a higher proportion than oxygen in the stoichiometric composition. Part of oxygen is released by heating from the oxide insulating film containing oxygen at a higher proportion than oxygen in the stoichiometric composition. The oxide insulating film containing oxygen at a higher proportion than oxygen in the stoichiometric composition is an oxide insulating film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis.

With the use of the oxide insulating film as the base insulating layer 106, oxygen is supplied to the semiconductor layer 102 through heat treatment or the like in the manufacturing process, which makes it possible to reduce oxygen vacancies in the semiconductor layer 102.

In the case of forming a silicon oxide film or a silicon oxynitride film as the base insulating layer 106 by a plasma CVD method, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

For example, a silicon oxide film or a silicon oxynitride film is formed under the conditions as follows: the substrate placed in a vacuum-evacuated treatment chamber of a plasma CVD apparatus is held at a temperature higher than or equal to 180° C. and lower than or equal to 260° C., preferably higher than or equal to 200° C. and lower than or equal to 240° C., to the treatment chamber is charged a source gas at a pressure greater than or equal to 100 Pa and less than or equal to 250 Pa, preferably greater than or equal to 100 Pa and less than or equal to 200 Pa, and high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the film formation conditions, the high-frequency power having the above power density is supplied to the treatment chamber having the above pressure, whereby the decomposition efficiency of the source gas in plasma is increased, oxygen radicals are increased, and oxidation of the source gas is promoted; therefore, the oxygen content of the oxide insulating film gets higher than that of the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen at a higher proportion than the stoichiometric composition and from which part of oxygen is released by heating.

[Insulating Layer]

For the insulating layer 107, the material relatively impermeable to oxygen can be used as described above. Furthermore, it is preferable that the insulating layer 107 be relatively impermeable to hydrogen or water. In particular, a material impermeable to oxygen, hydrogen, and water can be used. With the use of such a material for the insulating layer 107, it is possible to inhibit both diffusion of oxygen from the base insulating layer 106 to the outside and entry of hydrogen, water, or the like from the outside into the semiconductor layer 102 or the like.

In the case of forming a silicon nitride film or a silicon nitride oxide film as the insulating layer 107, a deposition gas containing silicon, an oxidizing gas, and a gas containing nitrogen are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples. As the gas containing nitrogen, nitrogen and ammonia can be given as examples.

Note that a layer which releases oxygen in a manner similar to that of the base insulating layer 106 may be provided under the insulating layer 107. In the case of providing a component such as a wiring over the insulating layer 107, an insulating layer serving as a planarization layer may be provided over the insulating layer 107.

The above is the description of an example of the structure of the transistor 100 and each of the components.

[Example of Manufacturing Method]

An example of a method for manufacturing the transistor 100 illustrated in FIGS. 1A to 1C is described below with reference to the drawings. FIGS. 3A to 3E are schematic cross-sectional views of steps in the example of the manufacturing method described below.

[Formation of Base Insulating Layer]

First, the base insulating layer 106 is formed over the substrate 101. The base insulating layer 106 can be formed by a sputtering method, a chemical vapor deposition (CVD) method, an evaporation method, or the like.

To make the base insulating layer 106 excessively contain oxygen, the base insulating layer 106 may be formed in an oxygen atmosphere, for example. Alternatively, the base insulating layer 106 may excessively contain oxygen in such a manner that oxygen is introduced into the base insulating layer 106 that has been formed. Both the methods may be combined.

For example, oxygen (at least including any of oxygen radicals, oxygen atoms, and oxygen ions) is introduced into the base insulating layer 106 which has been formed, whereby a region excessively containing oxygen is formed. Oxygen can be introduced by an ion implantation method, an ion doping method, a plasma immersion ion implantation method, plasma treatment, or the like.

A gas containing oxygen can be used for treatment for introducing oxygen. As the gas containing oxygen, oxygen, dinitrogen monoxide, nitrogen dioxide, carbon dioxide, carbon monoxide, or the like can be used. A dilution gas such as a rare gas may be contained in the gas containing oxygen in the treatment for introducing oxygen.

[Formation of Semiconductor Layer]

Figure 3A:
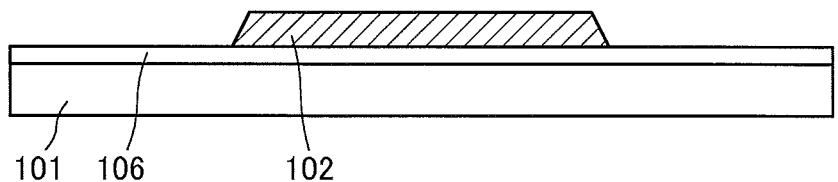
FIGS. 3A to 3E illustrate an example of a method for manufacturing a semiconductor device of an embodiment.

Next, a semiconductor film is formed over the base insulating layer 106. A resist mask is formed over the semiconductor film by photolithography or the like, an unnecessary portion is removed by etching, and then the resist mask is removed. Thus, the island-shaped semiconductor layer 102 can be formed (FIG. 3A).

The semiconductor film can be formed by a sputtering method, a CVD method, a molecular beam epitaxy (MBE) method, an atomic layer deposition (ALD) method, a pulsed laser deposition (PLD) method, or the like. Alternatively, a technique for formation of a thin film using a liquid material, such as a sol-gel method, a spray method, or a mist method, can be used. The semiconductor film is preferably formed by a sputtering method. As the sputtering method, an RF sputtering method, a DC sputtering method, an AC sputtering method, or the like can be used. In particular, a DC sputtering method is preferably used because dust generated in the deposition can be reduced and the film thickness can be uniform.

Note that heat treatment may be performed after the formation of the semiconductor film. The heat treatment may be performed at 250° C. or higher and 650° C. or lower, preferably 300° C. or higher and 500° C. or lower in an inert gas atmosphere, in an atmosphere containing an oxidization gas at 10 ppm or more, or under reduced pressure. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. By the heat treatment, oxygen is supplied from the base insulating layer 106 to the semiconductor film (or the semiconductor layer 102), which enables a reduction in oxygen vacancies in the oxide semiconductor included in the semiconductor layer 102. Note that the heat treatment may be performed directly after the formation of the semiconductor film or may be performed after the semiconductor film is processed into the island-shaped semiconductor layer 102.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme EUV, X-rays, or an electron beam because extremely minute processing can be performed. Note that in the case of performing exposure by scanning a beam such as an electron beam, a photomask is not needed.

[Formation of Barrier Layer and Pair of Electrodes]

Figure 3B:
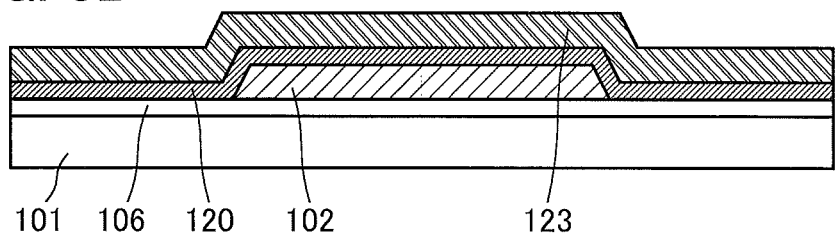

Next, a barrier film 120 and a conductive film 123 are formed over the base insulating layer 106 and the semiconductor layer 102 in this order (FIG. 3B).

The barrier film 120 can be formed by a method similar to the formation method of the semiconductor film.

The conductive film 123 can be formed by a sputtering method, an evaporation method, a CVD method, or the like.

A resist mask is formed over the conductive film 123 by photolithography or the like. Unnecessary portions of the conductive film 123 and the barrier film 120 are removed by etching. Then, the resist mask is removed. Thus, the pair of electrodes 103 and the barrier layer 110 in contact with the undersurfaces of the electrodes 103 are formed (FIG. 3C).

Figure 3C:
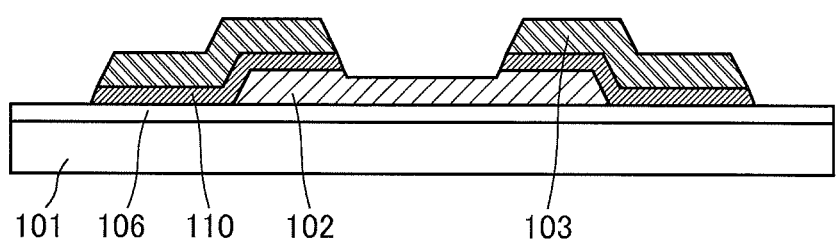

Here, as illustrated in FIG. 3C, in some cases, part of an upper portion of the semiconductor layer 102 is etched in the etching of the conductive film 123 and the barrier film 120 to reduce the thickness of a portion where the pair of electrodes 103 does not overlap with the semiconductor layer 102. For this reason, the semiconductor film serving as the semiconductor layer 102 is preferably formed to have a large thickness in advance in consideration of the thickness of the etched layer.

In the case where a material having an In content higher than that of the semiconductor layer 102 is used for the barrier layer 110, a region with high In concentration might be formed as a mixed layer of the material of the barrier layer 110 and the material of the semiconductor layer 102 over the top surface of the semiconductor layer 102 when the barrier film 120 is formed. Such a region acts as a parasitic channel when remains on the top surface of the semiconductor layer 102, so that desired transistor characteristics might not be obtained. For example, the threshold voltage of the transistor 100 is negatively shifted and the transistor is normally-on in some cases. For this reason, it is particularly effective to remove part of the upper portion of the semiconductor layer 102 when the conductive film 123 and the barrier film 120 are etched.

Although the method for etching the pair of electrodes 103 and the barrier layer 110 with the use of the same resist mask is described here, the pair of electrodes 103 and the barrier layer 110 may be processed separately. In this case, the pair of electrodes 103 and the barrier layer 110 are processed so that the electrodes 103 are placed on the inner side than end portions of the barrier layer 110 at least in a region which does not overlap with the semiconductor layer 102. Etching the pair of electrodes 103 and the barrier layer 110 with the use of the same resist mask is preferable, in which case the barrier layer 110 can be used without increasing the number of resist masks. In the case of using different photomasks for the electrodes 103 and the barrier layer 110, part of a region of the barrier film 120 that overlaps with the semiconductor layer 102 may be removed so that the electrodes 103 and the semiconductor layer 102 are in contact with each other.

[Formation of Gate Insulating Layer]

Next, the gate insulating layer 104 is formed over the semiconductor layer 102, the pair of electrodes 103, the barrier layer 110, and the base insulating layer 106.

The gate insulating layer 104 can be formed by a sputtering method, a CVD method, an MBE method, an ALD method, a PLD method, or the like. In particular, it is preferable that the gate insulating layer 104 be formed by a CVD method, more preferably a plasma CVD method because coverage can be further improved.

In addition, after the formation of the gate insulating layer 104, the treatment for introducing oxygen may be performed on the gate insulating layer 104. By introducing oxygen to the gate insulating layer 104 so that an excessive amount of oxygen is contained in the gate insulating layer 104, oxygen can be supplied to the semiconductor layer 102 through heat treatment performed later.

[Formation of Gate Electrode]

Figure 3D:
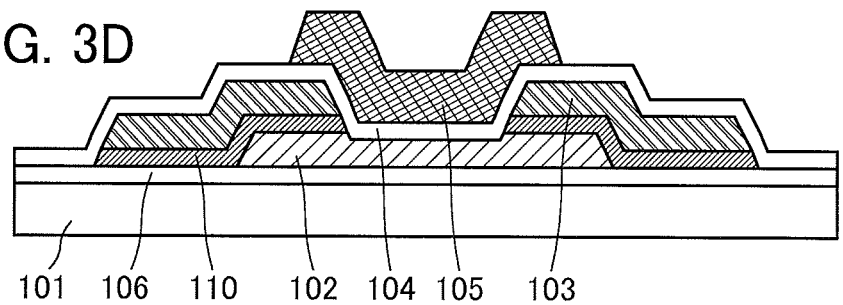

Next, a conductive film is formed over the gate insulating layer 104. A resist mask is formed over the conductive film by photolithography or the like, an unnecessary portion is removed by etching, and then the resist mask is removed. Thus, the gate electrode 105 can be formed (FIG. 3D).

The conductive film serving as the gate electrode 105 can be formed by a sputtering method, an evaporation method, a CVD method, or the like.

[Formation of Insulating Layer]

Next, the insulating layer 107 is formed over the gate insulating layer 104 and the gate electrode 105.

The insulating layer 107 can be formed by a sputtering method, a CVD method, an MBE method, an ALD method, a PLD method, or the like. In particular, it is preferable that the insulating layer 107 be formed by a CVD method, more preferably a plasma CVD method because coverage can be favorable.

[Heat Treatment]

Next, heat treatment is performed. Through the heat treatment, oxygen can be supplied from the base insulating layer 106 to the semiconductor layer 102 to reduce oxygen vacancies in the semiconductor layer 102. At this time, the barrier layer 110 provided in contact with the undersurfaces of the electrodes 103 can inhibit diffusion of oxygen from the base insulating layer 106 to the electrodes 103 effectively, resulting in an increase in the amount of oxygen supplied to the semiconductor layer 102.

In addition, through the heat treatment, part of oxygen in the barrier layer 110 is diffused into the electrodes 103, whereby oxygen vacancies are generated in a region in the vicinity of the interface between the electrodes 103 and the barrier layer 110 or generated entirely in the barrier layer 110 and such a region has n-type conductivity; thus, the resistance of the barrier layer 110 is reduced. As a result, the barrier layer 110 can function as part of the electrodes 103. In regions sandwiched between the semiconductor layer 102 and the electrodes 103, the barrier layer 110 can function as a source and a drain of the transistor.

Note that the heat treatment is performed after the formation of the insulating layer 107 here; however, the heat treatment may be performed any time after the conductive film serving as the pair of electrodes 103 is formed. In particular, the heat treatment is preferably performed in a state where the base insulating layer 106 is covered with the barrier film 120 or the insulating layer 107, in which case diffusion of oxygen from the base insulating layer 106 to the outside can be inhibited.

Figure 3E:
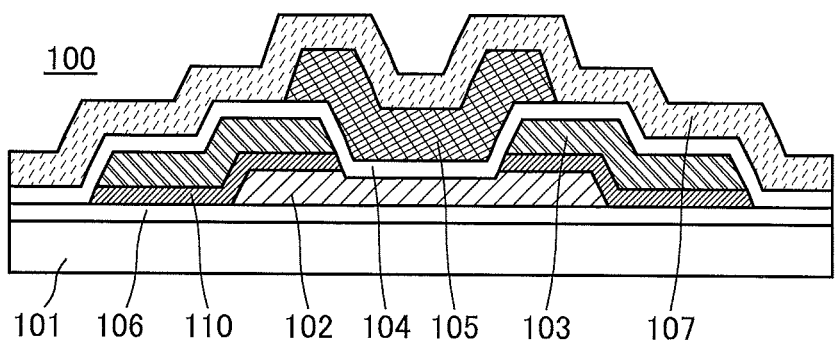

Through the above-described process, the transistor 100 can be manufactured (see FIG. 3E).

MODIFICATION EXAMPLE

Examples of structures of a transistor that are partly different from the structure of the transistor 100 described in the above example are described below. Note that description of the portions already described is omitted and only different portions are described in detail. Even when positions and shapes of components are different from those in the above example, the same reference numerals are used as long as the components have the same functions as those in the above example, and detailed description thereof is omitted in some cases.

Modification Example 1

Figure 4A:
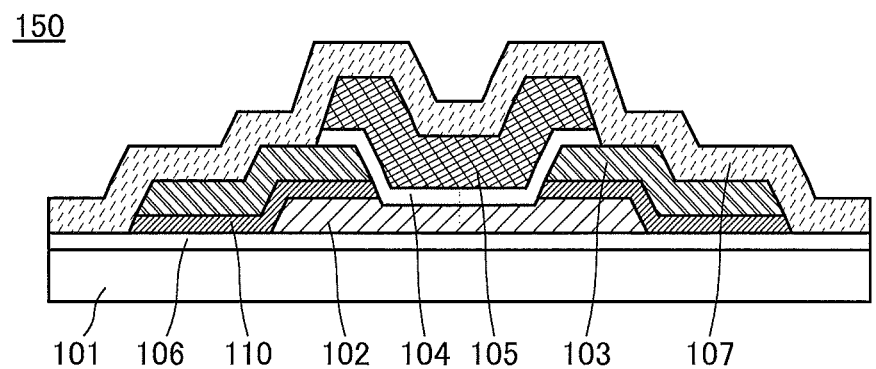
FIGS. 4A and 4B each illustrate an example of a structure of a semiconductor device of an embodiment.

FIG. 4A is a schematic cross-sectional view of a transistor 150 described below as an example. A main difference between the transistor 150 and the transistor 100 is the shape of the gate insulating layer 104.

The gate insulating layer 104 and the gate electrode 105 in the transistor 150 are processed with the use of the same photomask. Accordingly, the insulating layer 107 is provided in contact with the top surface of the base insulating layer 106, top surfaces and side surfaces of the electrodes 103, and side surfaces of the barrier layer 110.

By providing the insulating layer 107 in contact with the top surface of the base insulating layer 106 as described above, oxygen released from the base insulating layer 106 can be effectively inhibited from being diffused to the outside even in a region where the barrier layer 110 is not provided. Furthermore, the insulating layer 107 is provided in contact with the side surfaces of the barrier layer 110 and accordingly, the top surface of part of the base insulating layer 106 that is not in contact with the semiconductor layer 102 is in contact with the barrier layer 110 or the insulating layer 107. Thus, the layer relatively impermeable to oxygen can effectively keep oxygen, which might be diffused, in the base insulating layer 106, resulting in an increase in the amount of oxygen supplied to the semiconductor layer 102.

Modification Example 2

Figure 4B:
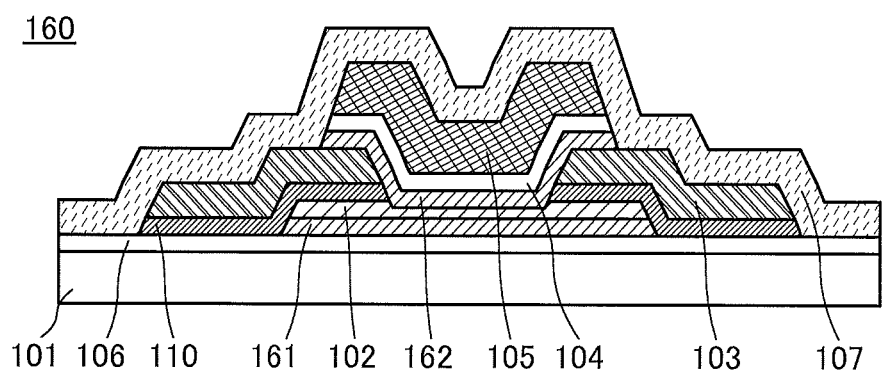

FIG. 4B is a schematic cross-sectional view of a transistor 160 described below as an example. The transistor 160 is different from the transistor 150 in that oxide layers are provided over and under the semiconductor layer 102.

The transistor 160 includes an oxide layer 161 over the base insulating layer 106, the semiconductor layer 102 over the oxide layer 161, a pair of barrier layers 110 and the pair of electrodes 103 over the semiconductor layer 102, an oxide layer 162 over the pair of electrodes 103 and the semiconductor layer 102, the gate insulating layer 104 over the oxide layer 162, and the gate electrode 105 over the gate insulating layer 104. The insulating layer 107 is provided over the base insulating layer 106, the electrodes 103, and the gate electrode 105.

The oxide layer 161 and the oxide layer 162 each contain oxide containing one or more metal elements contained in the semiconductor layer 102.

Note that the boundary between the semiconductor layer 102 and the oxide layer 161 or the boundary between the semiconductor layer 102 and the oxide layer 162 is not clear in some cases.

For example, the oxide layers 161 and 162 each contain In or Ga; the oxide layers 161 and 162 each contain, for example, a material typified by an In—Ga-based oxide, an In—Zn-based oxide, or an In—M—Zn-based oxide (M is Al, Ti, Ga, Y, Zr, La, Ce, Nd, or Hf). In addition, the energy of the conduction band minimum of the material is closer to a vacuum level than that of the semiconductor layer 102 is, and typically, the difference between the energy of the conduction band minimum of the oxide layer 161 or the oxide layer 162 and the energy of the conduction band minimum of the semiconductor layer 102 is preferably 0.05 eV or higher, 0.07 eV or higher, 0.1 eV or higher, or 0.15 eV or higher and 2 eV or lower, 1 eV or lower, 0.5 eV or lower, or 0.4 eV or lower.

An oxide having a Ga (serving as a stabilizer) content higher than that of the semiconductor layer 102 is used for the oxide layers 161 and 162, between which the semiconductor layer 102 is sandwiched, in which case release of oxygen from the semiconductor layer 102 can be inhibited.

When an In—Ga—Zn-based oxide in which the atomic ratio of In to Ga and Zn is 1:1:1 or 3:1:2 is used for the semiconductor layer 102, for example, an In—Ga—Zn-based oxide in which the atomic ratio of In to Ga and Zn is 1:3:2, 1:3:4, 1:3:6, 1:6:4, 1:6:8, 1:6:10, or 1:9:6 can be used for the oxide layer 161 or the oxide layer 162. Note that the atomic ratios in the semiconductor layer 102, the oxide layer 161, and the oxide layer 162 each have an error of ±20%. For the oxide layers 161 and 162, materials with the same composition or material with different compositions may be used.

Further, when an In—M—Zn-based oxide is used for the semiconductor layer 102, an oxide containing metal elements in the atomic ratio satisfying the following conditions is preferably used for a target for forming the semiconductor film serving as the semiconductor layer 102. Given that the atomic ratio of the metal elements in the oxide is In:M: Zn=$x_1$:$y_1$:$z_1$, $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are In:M:Zn=1:1:1, In:M:Zn=3:1:2, or the like.

When an In—M—Zn-based oxide is used for the oxide layers 161 and 162, an oxide containing metal elements in the following atomic ratio is preferably used for a target for forming oxide films serving as the oxide layers 161 and 162. Given that the atomic ratio of the metal elements in the oxide is In:M:Zn=$x_2$:$y_2$:$z_2$, $x_2/y_2$ is less than $x_1/y_1$, and $z_2/y_2$ is greater than or equal to ⅓ and less than or equal to 6, preferably greater than or equal to 1 and less than or equal to 6. Note that when $z_2/y_2$ is less than or equal to 6, a CAAC-OS film to be described later is easily formed. Typical examples of the atomic ratio of the metal elements in the target are In:M:Zn=1:3:4, In:M:Zn=1:3:6, In:M:Zn=1: 3:8, or the like.

By using a material in which the energy level of the conduction band minimum is closer to the vacuum level than that of the semiconductor layer 102 is for the oxide layers 161 and 162, a channel is mainly formed in the semiconductor layer 102, so that the semiconductor layer 102 serves as a main current path. When the semiconductor layer 102 in which a channel is formed is sandwiched between the oxide layers 161 and 162 as described above, generation of interface states between these layers is suppressed, and thus reliability of electrical characteristics of the transistor is improved.

Note that, without limitation to those described above, a material with an appropriate composition may be used depending on required semiconductor characteristics and electrical characteristics (e.g., field-effect mobility and threshold voltage) of a transistor. In order to obtain the required semiconductor characteristics of the transistor, it is preferable that the carrier density, the impurity concentration, the defect density, the atomic ratio of a metal element to oxygen, the interatomic distance, the density, and the like of each of the semiconductor layer 102, the oxide layer 161, and the oxide layer 162 be set to appropriate values.

In addition, in the transistor 160, the oxide layer 162, the gate insulating layer 104, and the gate electrode 105 are processed with the use of the same photomask such that end portions of the oxide layer 162 and end portions of the gate insulating layer 104 substantially are aligned with end portions of the gate electrode 105. The insulating layer 107 is provided in contact with the side surfaces of the oxide layer 162 and the side surfaces of the gate insulating layer 104. Such a structure can inhibit release of oxygen from the semiconductor layer 102 through the end portions of the oxide layer 162 and the end portions of the gate insulating layer 104.

The above is the description of the modification example.

This embodiment can be combined with any of the other embodiments disclosed in this specification as appropriate.

(Embodiment 2)

An oxide semiconductor that can be favorably used in a semiconductor device of one embodiment of the present invention is described in this embodiment.

An oxide semiconductor has a wide energy gap of 3.0 eV or more. A transistor using an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor using silicon.

An applicable oxide semiconductor preferably contains at least indium (In) or zinc (Zn). In particular, In and Zn are preferably contained. In addition, as a stabilizer for reducing variation in electric characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (such as cerium (Ce), neodymium (Nd), or gadolinium (Gd)) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In to Ga and Zn. The In—Ga—Zn-based oxide may contain another metal element in addition to In, Ga, and Zn.

Alternatively, as the oxide semiconductor, a material represented by $InMO_3(ZnO)_m$ (m>0 is satisfied, and m is not an integer) may be used. Note that M represents one or more metal elements selected from Ga, Fe, Mn, and Co, or the above-described element as a stabilizer. Still alternatively, as the oxide semiconductor, a material represented by a chemical formula, $In_2SnO_5(ZnO)_n$ (n>0 is satisfied, and n is an integer) may be used.

For example, an In—Ga—Zn-based oxide in which an atomic ratio of In to Ga and Zn is 1:1:1, 1:3:2, 1:3:4, 1:3:6, 3:1:2, or 2:1:3, or an oxide whose composition is in the neighborhood of the above compositions may be used.

When an oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. For this reason, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment or treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1 \times 10^{17}$ /cm$^3$, lower than or equal to $1 \times 10^{16}$ /cm$^3$, lower than or equal to $1 \times 10^{15}$ /cm$^3$, lower than or equal to $1 \times 10^{14}$ /cm$^3$, or lower than or equal to $1 \times 10^{13}$ /cm$^3$.

In this manner, a transistor including an i-type or substantially i-type oxide semiconductor film can have extremely favorable off-state current characteristics. For example, the drain current at the time when the transistor including the oxide semiconductor film is in an off-state can be less than or equal to $1 \times 10^{-18}$ A, preferably less than or equal to $1 \times 10^{-21}$ A, further preferably less than or equal to $1 \times 10^{-24}$ A at room temperature (approximately 25° C.); or less than or equal to $1 \times 10^{-15}$ A, preferably less than or equal to $1 \times 10^{-18}$ A, further preferably less than or equal to $1 \times 10^{-21}$ A at 85° C. Note that an off state of an n-channel transistor refers to a state where the gate voltage is sufficiently lower than the threshold voltage. Specifically, the transistor is in an off state when the gate voltage is lower than the threshold voltage by 1 V or more, 2 V or more, or 3 V or more.

A structure of an oxide semiconductor film is described below.

An oxide semiconductor film is classified roughly into a single-crystal oxide semiconductor film and a non-singlecrystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, the CAAC-OS film is described.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

The CAAC-OS film is one of oxide semiconductor films having a plurality of c-axis aligned crystal parts.

In a transmission electron microscope (IBM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface, of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, in the CAAC-OS film to which an impurity is added, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has a higher strength of binding to oxygen than that of a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Charge trapped by the carrier traps in the oxide semiconductor film takes a long time to be released, and might behave like fixed charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, the microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film which is obtained by using an electron beam having a probe diameter (e.g., greater than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor an may be a stacked film including two or more films of an amorphous oxide semiconductor film, a microcrystalline oxide semiconductor film, and a CAAC-OS film, for example.

(Embodiment 3)

In this embodiment, with reference to the drawings, description is given of an example of a semiconductor device (memory device) which uses a transistor of one embodiment of the present invention, is capable of holding stored data even when not powered, and has an unlimited number of write cycles.

Figure 5A:
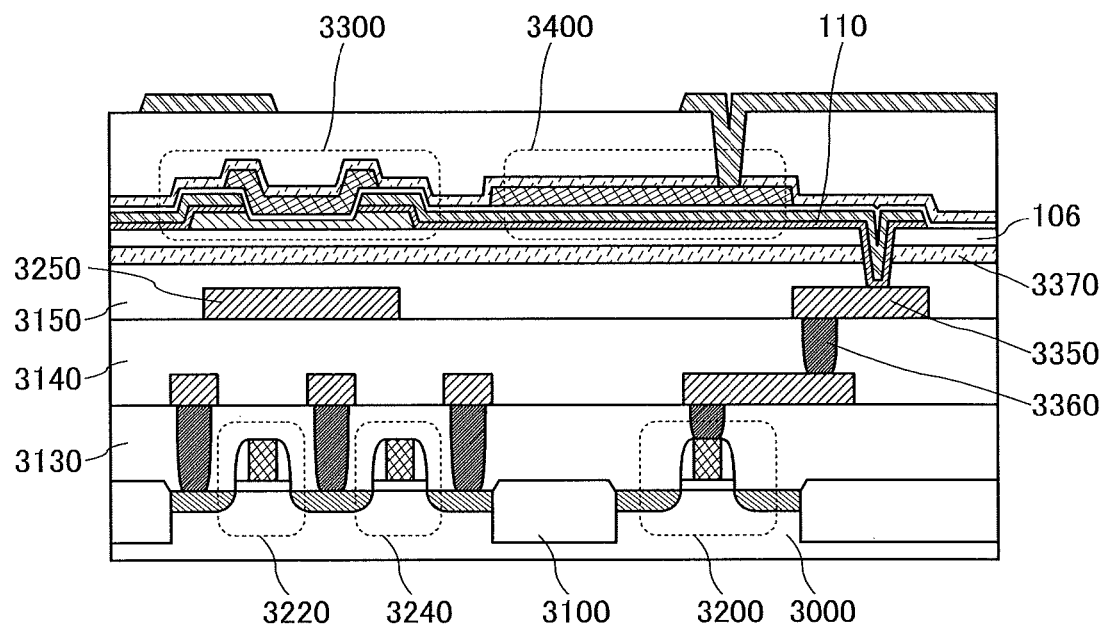
FIGS. 5A and 5B are a cross-sectional view and a circuit diagram of a semiconductor device of an embodiment.
Figure 5B:
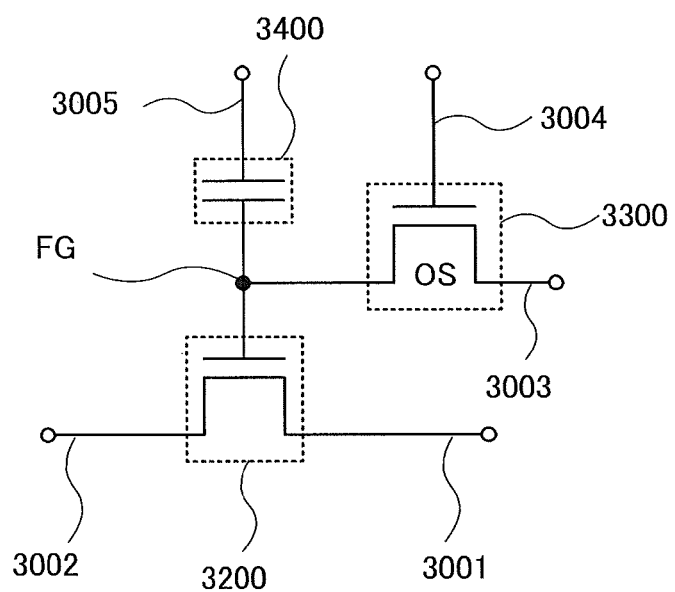

FIG. 5A is a cross-sectional view of the semiconductor device, and FIG. 5B is a circuit diagram of the semiconductor device.

In the semiconductor device illustrated in FIGS. 5A and 5B, a transistor 3200 using a first semiconductor material is included in a lower portion, and a transistor 3300 using a second semiconductor material and a capacitor 3400 are included in an upper portion. As the transistor 3300, the transistor described in Embodiment 1 can be used. An example of using the transistor 100 is illustrated in FIG. 5A.

One electrode of the capacitor 3400 is formed using the same material as a source electrode and a drain electrode of the transistor 3300, the other electrode of the capacitor 3400 is formed using the same material as a gate electrode of the transistor 3300, and a dielectric of the capacitor 3400 is formed using the same material as a gate insulating layer of the transistor 3300; thus, the capacitor 3400 and the transistor 3300 can be formed at the same time.

Here, the first semiconductor material and the second semiconductor material are preferably materials having different band gaps. For example, a semiconductor material other than an oxide semiconductor (e.g., silicon, germanium, silicon germanium, silicon carbide, or gallium arsenide) can be used as the first semiconductor material, and the oxide semiconductor described in Embodiment 1 can be used as the second semiconductor material. A transistor using a material other than an oxide semiconductor, such as single crystal silicon, can operate at high speed easily. On the other hand, a transistor using an oxide semiconductor enables charge to be held for a long time owing to its electrical characteristics, that is, the low off-state current.

Although all the transistors are n-channel transistors here, it is needless to say that p-channel transistors can also be used. The specific structure of the semiconductor device, such as the material used for the semiconductor device and the structure of the semiconductor device, is not necessarily limited to those described here except for the use of the transistor described in Embodiment 1, which is formed using an oxide semiconductor, to hold data.

The transistor 3200, a transistor 3220, and a transistor 3240 in FIG. 5A each include a channel formation region provided in a substrate 3000 including a semiconductor material (such as crystalline silicon), impurity regions provided such that the channel formation region is provided therebetween, intermetallic compound regions provided in contact with the impurity regions, a gate insulating layer provided over the channel formation region, and a gate electrode provided over the gate insulating layer. Note that a transistor whose source electrode and drain electrode are not illustrated explicitly in a drawing may be referred to as a transistor for the sake of convenience. Further, in such a case, in description of connection relation of a transistor, a source region and a source electrode are collectively referred to as a "source electrode" and a drain region and a drain electrode are collectively referred to as a "drain electrode". That is, in this specification, the term "source electrode" may include a source region.

Over the substrate 3000, an element isolation insulating layer 3100 is provided to surround each of the transistors 3200, 3220, and 3240. A plurality of insulating layers, such as an insulating layer 3130, an insulating layer 3140, and an insulating layer 3150, are provided to cover the transistors 3200, 3220, and 3240. A plurality of connection wirings are provided over the insulating layers 3130 and 3140. With a plug 3360 embedded in the insulating layer 3130 or the insulating layer 3140, the plurality of connection wirings are electrically connected to each other or the plurality of connection wirings are electrically connected to the transistor. Note that the element isolation insulating layer 3100 can be formed by an element isolation technique such as local oxidation of silicon (LOCOS) or shallow trench isolation (STI).

For example, when the transistors 3200, 3220, and 3240 are each formed using a crystalline silicon substrate, the transistors 3200, 3220, and 3240 can operate at high speed. Thus, the use of the transistor 3200 as a reading transistor allows data to be read at high speed.

The transistor 3300 is provided over the insulating layer 3150, and one of the source electrode and the drain electrode thereof is extended to serve as the one electrode of the capacitor 3400. The one electrode of the capacitor 3400 is electrically connected to the gate electrode layer of the transistor 3200 through a connection wiring 3350, the plug 3360, and the like.

The transistor 3300 in FIG. 5A is a top-gate transistor in which a channel is formed in a semiconductor layer including an oxide semiconductor. Since the off-state current of the transistor 3300 is small, stored data can be held for a long period owing to such a transistor. In other words, power consumption can be sufficiently reduced because a semiconductor device in which refresh operation is unnecessary or the frequency of refresh operation is extremely low can be provided.

Further, an electrode 3250 is provided so that the transistor 3300 overlaps with the electrode 3250 with the insulating layer 3150 provided therebetween. By supplying an appropriate potential to the electrode 3250 as a second gate electrode, the threshold voltage of the transistor 3300 can be controlled. In addition, long-term reliability of the transistor 3300 can be improved. When the electrode 3250 operates with the same potential as that of the gate electrode of the transistor 3300, on-state current can be increased. Note that the electrode 3250 is not necessarily provided.

The transistor 3300 and the capacitor 3400 can be formed over the substrate on which the transistor 3200 is formed as illustrated in FIG. 5A, resulting in an increase in the degree of the integration of the semiconductor device.

Here, an insulating layer 3370 and the base insulating layer 106 are stacked over the insulating layer 3150, and the transistor 3300 is provided over the base insulating layer 106. The insulating layer 3370 is preferably a layer relatively impermeable to oxygen which is similar to the insulating layer 107 described in Embodiment 1. By providing the insulating layer 3370 below the base insulating layer 106, oxygen released from the base insulating layer 106 is effectively inhibited from being diffused into a portion below the insulating layer 3370; thus, the amount of oxygen supplied to a semiconductor layer of the transistor 3300 can be increased.

The barrier layer 110 in contact with undersurfaces of the source electrode and the drain electrode of the transistor 3300 is also in contact with side surfaces of the insulating layer 3150, the insulating layer 3370, and the base insulating layer 106 in an opening provided in the insulating layer 3150, the insulating layer 3370, and the base insulating layer 106. Furthermore, the barrier layer 110 is in contact with a top surface of the connection wiring 3350 positioned under the opening. Accordingly, an oxygen diffusion path to the portion below the insulating layer 3370 can be blocked also in the opening.

An example of a circuit configuration corresponding to part of FIG. 5A is illustrated in FIG. 5B.

In FIG. 5B, a first wiring 3001 is electrically connected to a source electrode of the transistor 3200. A second wiring 3002 is electrically connected to a drain electrode of the transistor 3200. A third wiring 3003 is electrically connected to the one of the source electrode and the drain electrode of the transistor 3300. A fourth wiring 3004 is electrically connected to the gate electrode of the transistor 3300. The gate electrode of the transistor 3200 and the other of the source electrode and the drain electrode of the transistor 3300 are electrically connected to the one electrode of the capacitor 3400. A fifth wiring 3005 is electrically connected to the other electrode of the capacitor 3400. Note that components corresponding to the transistor 3220, the transistor 3240, the electrode 3250, and the like are not illustrated.

The semiconductor device in FIG. 5B utilizes a characteristic in which the potential of the gate electrode of the transistor 3200 can be held, and thus enables writing, holding, and reading of data as follows.

Writing and holding of data are described. First, the potential of the fourth wiring 3004 is set to a potential at which the transistor 3300 is turned on, so that the transistor 3300 is turned on. Accordingly, the potential of the third wiring 3003 is applied to the gate electrode of the transistor 3200 and the capacitor 3400. That is, predetermined charge is given to the gate electrode of the transistor 3200 (writing). Here, one of two kinds of charges providing different potential levels (hereinafter referred to as a low-level charge and a high-level charge) is given. Then, the potential of the fourth wiring 3004 is set to a potential at which the transistor 3300 is turned off, so that the transistor 3300 is turned off. Thus, the charge given to the gate electrode of the transistor 3200 is held (holding).

Since the off-state current of the transistor 3300 is extremely small, the charge of the gate electrode of the transistor 3200 is held for a long time.

Next, reading of data is described. By supplying an appropriate potential (a reading potential) to the fifth wiring 3005 while supplying a predetermined potential (a constant potential) to the first wiring 3001, the potential of the second wiring 3002 varies depending on the amount of charge held in the gate electrode of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$ in the case where a low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge is given to the gate electrode of the transistor 3200 can be determined. For example, in the case where the high-level charge is given in writing, when the potential of the fifth wiring 3005 is $V_0$ ($>V_{th\_H}$), the transistor 3200 is turned on. In the case where the low-level charge is given in writing, even when the potential of the fifth wiring 3005 is $V_0$ ($<V_{th\_L}$), the transistor 3200 remains off. Therefore, the data held in the gate electrode can be read by determining the potential of the second wiring 3002.

Note that in the case where memory cells are arrayed to be used, only data of desired memory cells needs to be read. In the case where such reading is not performed, a potential at which the transistor 3200 is off regardless of the state of the gate electrode, that is, a potential smaller than $V_{th\_H}$ may be applied to the fifth wiring 3005. Alternatively, a potential at which the transistor 3200 is on regardless of the state of the gate electrode, that is, a potential larger than $V_{th\_L}$ may be applied to the fifth wiring 3005.

When a transistor having a channel formation region formed using an oxide semiconductor and having extremely small off-state current is applied to the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Furthermore, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not arise. In other words, the semiconductor device of one embodiment of the present invention does not have a limit on the number of times of writing which is a problem in the conventional nonvolatile memory, and reliability thereof is drastically improved. Moreover, data is written depending on the on state and the off state of the transistor, whereby high-speed operation can be easily achieved.

As described above, a miniaturized and highly integrated semiconductor device having favorable electrical characteristics can be provided.

This embodiment can be combined with any of the other embodiments disclosed in this specification as appropriate.

(Embodiment 4)

In this embodiment, description is given of a semiconductor device using a transistor of one embodiment of the present invention, which can hold stored data even when not powered, which does not have a limitation on the number of write cycles, and which has a structure different from that described in Embodiment 3.

Figure 6:
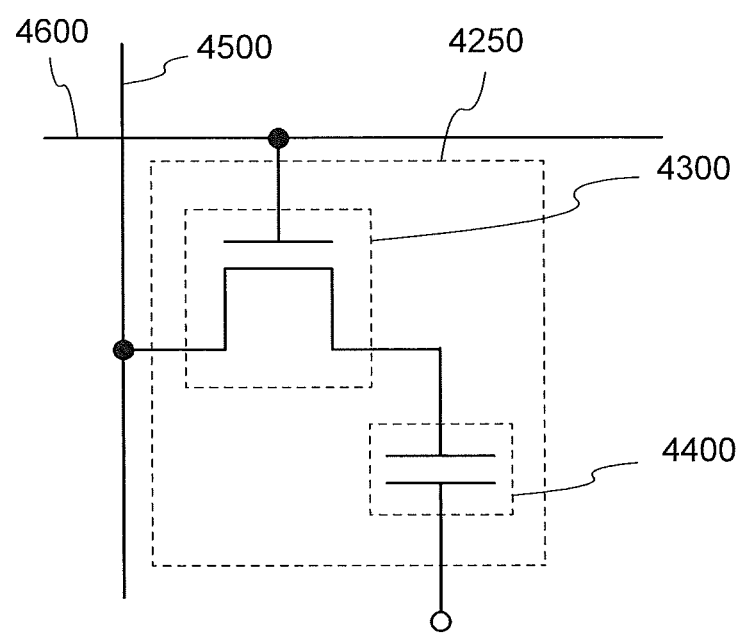
FIG. 6 is a circuit diagram of a semiconductor device of an embodiment.

FIG. 6 illustrates an example of a circuit configuration of the semiconductor device. In the semiconductor device, a first wiring 4500 is electrically connected to a source electrode of a transistor 4300, a second wiring 4600 is electrically connected to a first gate electrode of the transistor 4300, and a drain electrode of the transistor 4300 is electrically connected to one terminal of a capacitor 4400. Note that the transistor described in Embodiment 1 can be used as the transistor 4300 included in the semiconductor device. The first wiring 4500 can serve as a bit line and the second wiring 4600 can serve as a word line.

The semiconductor device (a memory cell 4250) can have a connection mode similar to that of the transistor 3300 and the capacitor 3400 illustrated in FIGS. 5A and 5B. Thus, the capacitor 4400 can be formed through the same process and at the same time as the transistor 4300 in a manner similar to that of the capacitor 3400 described in Embodiment 3.

Next, writing and holding of data in the semiconductor device (the memory cell 4250) illustrated in FIG. 6 are described.

First, a potential at which the transistor 4300 is turned on is supplied to the second wiring 4600, so that the transistor 4300 is turned on. Accordingly, the potential of the first wiring 4500 is applied to the one terminal of the capacitor 4400 (writing). After that, the potential of the second wiring 4600 is set to a potential at which the transistor 4300 is turned off, so that the transistor 4300 is turned off. Thus, the potential of the one terminal of the capacitor 4400 is held (holding).

The transistor 4300 including an oxide semiconductor has an extremely small off-state current. For this reason, the potential of the one terminal of the capacitor 4400 (or a charge accumulated in the capacitor 4400) can be held for an extremely long time by turning off the transistor 4300.

Next, reading of data is described. When the transistor 4300 is turned on, the first wiring 4500 which is in a floating state and the capacitor 4400 are electrically connected to each other, and the charge is redistributed between the first wiring 4500 and the capacitor 4400. As a result, the potential of the first wiring 4500 is changed. The amount of change in potential of the first wiring 4500 varies depending on the potential of the one terminal of the capacitor 4400 (or the charge accumulated in the capacitor 4400).

For example, the potential of the first wiring 4500 after charge redistribution is $(C_B \times V_{B0} + C \times V)(C_B + C)$, where V is the potential of the one terminal of the capacitor 4400, C is the capacitance of the capacitor 4400, $C_B$ is the capacitance component of the first wiring 4500, and $V_{B0}$ is the potential of the first wiring 4500 before the charge redistribution. Therefore, it can be found that assuming that the memory cell 4250 is in either of two states in which the potentials of the one terminal of the capacitor 4400 are $V_1$ and $V_0$ ($V_1 > V_0$), the potential of the first wiring 4500 in the case of holding the potential $V_1$ ($=(C_B \times V_{B0} + C \times V_1)(C_B + C)$) is higher than the potential of the first wiring 4500 in the case of holding the potential $V_0$ ($=(C_B \times V_{B0} + C \times V_0)(C_B + C)$).

Then, by comparing the potential of the first wiring 4500 with a predetermined potential, data can be read.

As described above, the semiconductor device (the memory cell 4250) illustrated in FIG. 6 can hold charge that is accumulated in the capacitor 4400 for a long time because the off-state current of the transistor 4300 is extremely small. In other words, power consumption can be sufficiently reduced because refresh operation becomes unnecessary or the frequency of refresh operation can be extremely low. Moreover, stored data can be held for a long time even when power is not supplied.

A substrate over which a driver circuit for the memory cell 4250 is formed and the memory cell 4250 illustrated in FIG. 6 are preferably stacked. When the memory cell 4250 and the driver circuit are stacked, the size of the semiconductor device can be reduced. Note that there is no limitation on the numbers of the memory cells 4250 and the driver circuits which are stacked.

It is preferable that a semiconductor material of a transistor included in the driver circuit be different from that of the transistor 4300. For example, silicon, germanium, silicon germanium, silicon carbide, gallium arsenide, or the like can be used, and a single crystal semiconductor is preferably used. A transistor formed using such a semiconductor material can operate at higher speed than a transistor formed using an oxide semiconductor and is suitable for the driver circuit for the memory cell 4250.

As described above, a miniaturized and highly integrated semiconductor device having favorable electrical characteristics can be provided.

This embodiment can be combined with any of the other embodiments disclosed in this specification as appropriate.

(Embodiment 5)

In this embodiment, description is given of a CPU in which at least the transistor described in any of the above embodiments can be used and the memory device described in Embodiment 3 or 4 is included.

Figure 7:
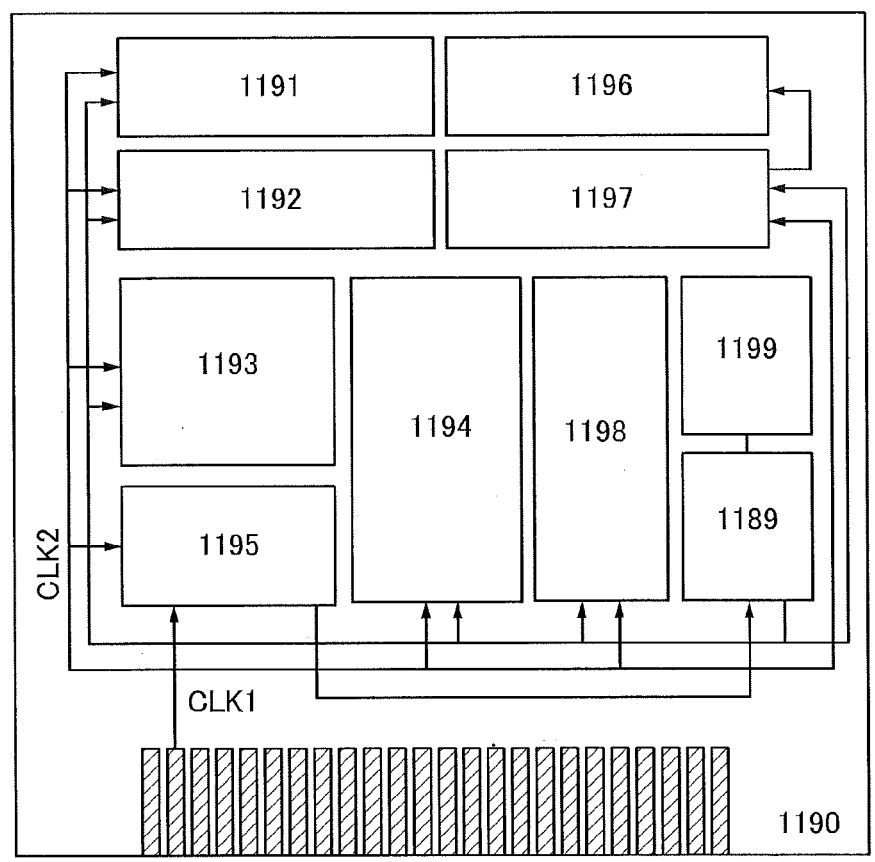
FIG. 7 is a block diagram of a semiconductor device of an embodiment.

FIG. 7 is a block diagram illustrating an example of the configuration of a CPU at least partly including any of the transistors described in Embodiment 1.

The CPU illustrated in FIG. 7 includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 7 is just an example of a simplified configuration, and an actual CPU may have a variety of configurations depending on the application. For example, the CPU may have the following configuration: a structure including the CPU illustrated in FIG. 7 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 7, a memory cell is provided in the register 1196. For the memory cell of the register 1196, any of the transistors described in the above embodiments can be used.

In the CPU illustrated in FIG. 7, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 8:
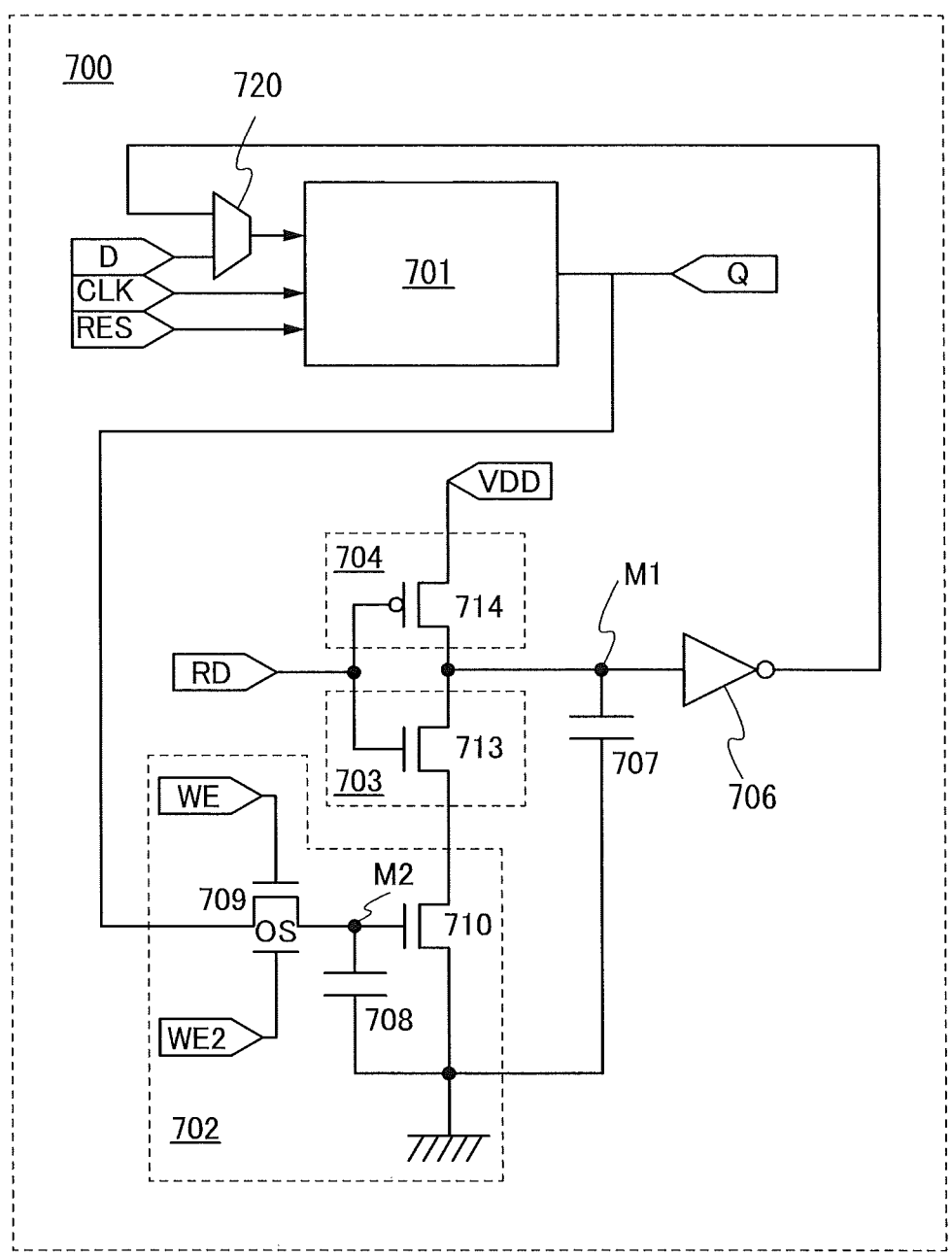
FIG. 8 is a circuit diagram of a memory device of an embodiment.

FIG. 8 is an example of a circuit diagram of a memory element that can be used as the register 1196. A memory element 700 includes a circuit 701 in which stored data is volatile when power supply is stopped, a circuit 702 in which stored data is nonvolatile when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the memory device described in Embodiment 4 can be used as the circuit 702. When supply of the power supply voltage to the memory element 700 is stopped, a ground potential (0 V) or a potential at which the transistor 709 is turned off continues to be input to a gate of the transistor 709 in the circuit 702. For example, the gate of the transistor 709 is grounded through a load such as a resistor.

An example in which the switch 703 is a transistor 713 having one conductivity type (e.g., an n-channel transistor) and the switch 704 is a transistor 714 having a conductivity type opposite to the one conductivity type (e.g., a p-channel transistor) is described. Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 708 can be supplied with a low power supply potential (e.g., GND) or a high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to the first gate (first gate electrode) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the circuit 701 is input to the other of the source and the drain of the transistor 709. FIG. 8 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 8, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where a node in which a signal obtained by inversion of the logic value of a signal input from the input terminal is held is provided in the circuit 701, the signal output from the second terminal of the switch 703 (the other of the source and the drain of the transistor 713) can be input to the node.

As the transistor 709 in FIG. 8, any of the transistors described in Embodiment 1 can be used. As described in Embodiment 3, the transistor 709 preferably includes a second gate (second gate electrode). The control signal WE can be input to the first gate and the control signal WE2 can be input to the second gate. The control signal WE2 is a signal having a constant potential. As the constant potential, for example, a ground potential GND or a potential lower than a source potential of the transistor 709 is selected. The control signal WE2 is a potential signal for controlling the threshold voltage of the transistor 709, and the cut-off current (Icut) of the transistor 709 can be further reduced. Note that as the transistor 709, the transistor without the second gate can be used.

Furthermore, in FIG. 8, the transistors included in the memory element 700 except for the transistor 709 can each be a transistor in which a channel is formed in a layer formed using a semiconductor other than an oxide semiconductor or in the substrate 1190. For example, the transistor can be a transistor in which a channel is formed in a silicon layer or a silicon substrate. Alternatively, a transistor in which a channel is formed in an oxide semiconductor layer can be used for all the transistors used for the memory element 700. Alternatively, in the memory element 700, a transistor in which a channel is formed in an oxide semiconductor layer can be included besides the transistor 709, and a transistor in which a channel is formed in a layer or the substrate 1190 including a semiconductor other than an oxide semiconductor can be used for the rest of the transistors.

As the circuit 701 in FIG. 8, for example, a flip-flop circuit can be used. As the logic element 706, for example, an inverter, a clocked inverter, or the like can be used.

In the semiconductor device of one embodiment of the present invention, in a period during which the memory element 700 is not supplied with the power supply voltage, data stored in the circuit 701 can be held by the capacitor 708 which is provided in the circuit 702.

The off-state current of a transistor in which a channel is formed in an oxide semiconductor layer is extremely small. For example, the off-state current of a transistor whose channel is formed in an oxide semiconductor layer is much lower than that of a transistor whose channel is formed in crystalline silicon. Thus, when such a transistor including an oxide semiconductor is used for the transistor 709, a signal held in the capacitor 708 is held for a long time also in a period during which the power supply voltage is not supplied to the memory element 700. The memory element 700 can accordingly hold the stored content (data) also in a period during which the supply of the power supply voltage is stopped.

With the switch 703 and the switch 704, the memory element performs pre-charge operation; thus, the time required for the circuit 701 to hold original data again after the supply of the power supply voltage is restarted can be shortened.

In the circuit 702, a signal held by the capacitor 708 is input to the gate of the transistor 710. Therefore, after supply of the power supply voltage to the memory element 700 is restarted, the signal held by the capacitor 708 can be converted into the one corresponding to the state (the on state or the off state) of the transistor 710 to be read from the circuit 702. Consequently, an original signal can be accurately read even when a potential corresponding to the signal held by the capacitor 708 fluctuates to some degree.

By using the above-described memory element 700 in a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be reduced.

Although an example of using the memory element 700 in the CPU is described in this embodiment, the memory element 700 can also be used in a digital signal processor (DSP), a custom LSI, an LSI such as a programmable logic device (PLD), and a radio frequency identification (RF-ID).

This embodiment can be combined with any of the other embodiments described in this specification as appropriate.

(Embodiment 6)

In this embodiment, description is given of examples of an electronic device which can include any of the transistors described in Embodiment 1, the memory device described in Embodiment 3 or 4, or the CPU and the like (e.g., a DSP, a custom LSI, PLD, and an RF-ID) described in Embodiment 5.

Any of the transistors described in Embodiment 1, the memory device described in Embodiment 3 or 4, or the CPU and the like described in Embodiment 5 can be used in a variety of electronic devices (including game machines). Examples of the electronic devices include display devices of televisions, monitors, and the like, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers and X-ray diagnostic equipment. The examples of the electronic devices further include alarm devices such as smoke detectors, heat detectors, gas alarm devices, and security alarm devices. In addition, industrial equipment such as guide lights, traffic lights, belt conveyors, elevators, escalators, industrial robots, and power storage systems can be included in the examples. Furthermore, moving objects and the like driven by fuel engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Some specific examples of these electronic devices are illustrated in FIGS. 9A to 9C.

Figure 9A:
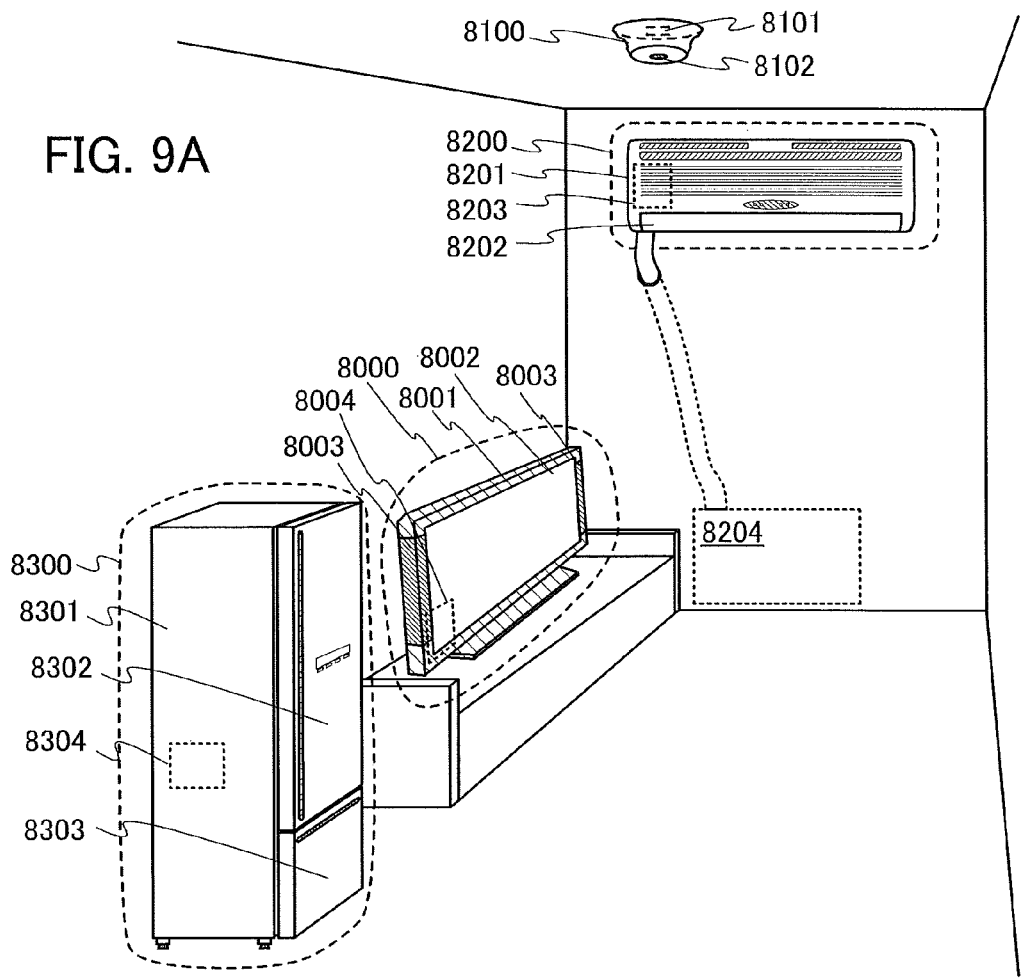
FIGS. 9A to 9C illustrate electronic devices of an embodiment.
Figure 9B:
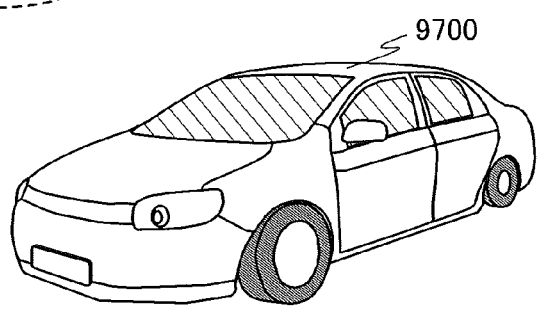
Figure 9C:
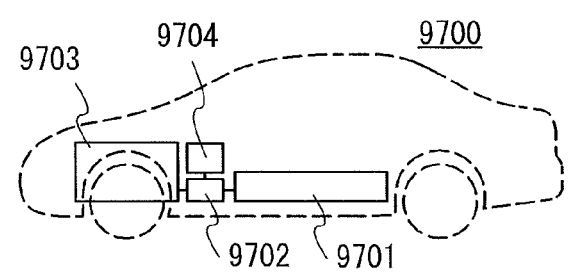

In a television set 8000 illustrated in FIG. 9A, a display portion 8002 is incorporated in a housing 8001. The display portion 8002 can display an image and a speaker portion 8003 can output sound. Any of the transistors described in Embodiment 1 can be used in a pixel or a driver circuit for operating the display portion 8002 incorporated in the housing 8001.

A semiconductor display device such as a liquid crystal display device, a light-emitting device in which a light-emitting element such as an organic EL element is provided in each pixel, an electrophoretic display device, a digital micromirror device (DMD), or a plasma display panel (PDP) can be used for the display portion 8002.

The television set 8000 may be provided with a receiver, a modem, and the like. With the receiver, a general television broadcast can be received. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU 8004 for performing information communication or a memory. The transistor, the memory device, or the CPU described in any of the above embodiments is used for the CPU 8004 or the memory, whereby power consumption can be reduced.

An alarm device 8100 illustrated in FIG. 9A is a residential fire alarm, and includes a sensor portion 8102 for smoke or heat and a microcomputer 8101. The microcomputer 8101 is an example of an electronic device including the transistor, the memory device, or the CPU described in any of the above embodiments.

An air conditioner which includes an indoor unit 8200 and an outdoor unit 8204 illustrated in FIG. 9A is an example of an electronic device including the transistor, the memory device, the CPU, or the like described in any of the above embodiments. Specifically, the indoor unit 8200 includes a housing 8201, an air outlet 8202, a CPU 8203, and the like. Although the CPU 8203 is provided in the indoor unit 8200 in FIG. 9A, the CPU 8203 may be provided in the outdoor unit 8204. Alternatively, the CPU 8203 may be provided in both the indoor unit 8200 and the outdoor unit 8204. Any of the transistors described in Embodiment 1 is used in the CPU in the air conditioner, whereby power consumption can be reduced.

An electronic refrigerator-freezer 8300 illustrated in FIG. 9A is an example of an electronic device including the transistor, the memory device, the CPU, or the like described in any of the above embodiments. Specifically, the electric refrigerator-freezer 8300 includes a housing 8301, a door for a refrigerator 8302, a door for a freezer 8303, a CPU 8304, and the like. In FIG. 9A, the CPU 8304 is provided in the housing 8301. Any of the transistors described in Embodiment 1 is used in the CPU 8304 of the electric refrigerator-freezer 8300, whereby power consumption can be reduced.

FIG. 9B illustrates an example of an electric vehicle which is an example of an electronic device. An electric vehicle 9700 is equipped with a secondary battery 9701. The output of the electric power of the secondary battery 9701 is adjusted by a circuit 9702 and the electric power is supplied to a driving device 9703. The circuit 9702 is controlled by a processing unit 9704 including a ROM, a RAM, a CPU, or the like which is not illustrated. Any of the transistors described in Embodiment 1 is used in the CPU in the electric vehicle 9700, whereby power consumption can be reduced.

The driving device 9703 includes a DC motor or an AC motor either alone or in combination with an internal-combustion engine. The processing unit 9704 outputs a control signal to the circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be combined with any of the other embodiments disclosed in this specification as appropriate.

EXPLANATION OF REFERENCE

100: transistor, 101: substrate, 102: semiconductor layer, 103: electrode, 104: gate insulating layer, 105: gate electrode, 106: base insulating layer, 107: insulating layer, 110: barrier layer, 112: oxygen, 120: barrier film, 123: conductive film, 150: transistor, 160: transistor, 161: oxide layer, 162: oxide layer, 700: memory element, 701: circuit, 702: circuit, 703: switch, 704: switch, 706: logic element, 707: capacitor, 708: capacitor, 709: transistor, 710: transistor, 713: transistor, 714: transistor, 720: circuit, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 3000: substrate, 3001: wiring, 3002: wiring, 3003: wiring, 3004: wiring, 3005: wiring, 3100: element isolation insulating layer, 3130: insulating layer, 3140: insulating layer, 3150: insulating layer, 3200: transistor, 3220: transistor, 3240: transistor, 3250: electrode, 3300: transistor, 3350: connection wiring, 3360: plug, 3370: insulating layer, 3400: capacitor, 4250: memory cell, 4300: transistor, 4400: capacitor, 4500: wiring, 4600: wiring, 8000: television set, 8001: housing, 8002: display portion, 8003: speaker portion, 8004: CPU, 8100: alarm device, 8101: microcomputer, 8102: sensor portion, 8200: indoor unit, 8201: housing, 8202: air outlet, 8203: CPU, 8204: outdoor unit, 8300: electric refrigerator-freezer, 8301: housing, 8302: door for a refrigerator, 8303: door for a freezer, 8304: CPU, 9700: electric vehicle, 9701: secondary battery, 9702: circuit, 9703: driving device, and 9704: processing unit.

This application is based on Japanese Patent Application serial no. 2013-096364 filed with Japan Patent Office on May 1, 2013, the entire contents of which are hereby incorporated by reference.

The invention claimed is:

1. A semiconductor device comprising:
a first transistor comprising a semiconductor material;
a wiring over the first transistor;
a first insulating layer over the wiring; and
a second transistor over the first insulating layer, the second transistor comprising:
an oxide semiconductor layer over the first insulating layer;
a source electrode and a drain electrode over the oxide semiconductor layer;
a first barrier layer between the oxide semiconductor layer and one of the source electrode and the drain electrode;
a second barrier layer between the oxide semiconductor layer and the other of the source electrode and the drain electrode;
a gate insulating layer over the source electrode and the drain electrode; and
a gate electrode over the gate insulating layer,
wherein the semiconductor material comprises at least one of silicon, germanium, silicon germanium, silicon carbide, and gallium arsenide,
wherein each of the first barrier layer and the second barrier layer comprises an oxide including indium, zinc and a first metal,
wherein the oxide semiconductor layer comprises indium, zinc, and the first metal,
wherein the first metal is one of aluminum, titanium, gallium, yttrium, zirconium, lanthanum, cerium, neodymium, and hafnium,
wherein the first barrier layer is in contact with the wiring through an opening provided in the first insulating layer,
wherein the oxide semiconductor layer comprises a first region extending from one edge to the other edge of the oxide semiconductor layer when seen from a top of the semiconductor device, and
wherein one of the first barrier layer and the second barrier layer, one of the source electrode and the drain electrode, and the gate electrode overlap with an entirety of the first region of the oxide semiconductor layer when seen from the top of the semiconductor device.

2. The semiconductor device according to claim 1, wherein the second transistor further comprises a second gate electrode under the first insulating layer.

3. The semiconductor device according to claim 1, wherein a content of the first metal of each of the first barrier layer and the second barrier layer is lower than or equal to an indium content of each of the first barrier layer and the second barrier layer.

4. The semiconductor device according to claim 1,
wherein the first insulating layer comprises silicon oxide or silicon oxynitride, and
wherein the first insulating layer comprises oxygen at a higher proportion than a stoichiometric composition of the first insulating layer.

5. The semiconductor device according to claim 1, wherein each of the source electrode and the drain electrode comprises at least one of aluminum, chromium, copper, tantalum, titanium, and molybdenum.

6. The semiconductor device according to claim 1, further comprising a second insulating layer over the second transistor,
wherein the second insulating layer comprises at least one of silicon nitride, silicon nitride oxide, aluminum oxide, aluminum oxynitride, gallium oxide, gallium oxynitride, yttrium oxide, yttrium oxynitride, hafnium oxide, and hafnium oxynitride.

7. The semiconductor device according to claim 1, wherein each of the first barrier layer and the second barrier layer has a thickness greater than or equal to 3 nm and less than or equal to 100 nm.

8. The semiconductor device according to claim 1, wherein a shape of one of the first barrier layer and the second barrier layer and a shape of one of the source electrode and the drain electrode are substantially aligned with each other when seen from above.

9. The semiconductor device according to claim 1, wherein a width of the oxide semiconductor layer is smaller than a width of each of the first barrier layer and the second barrier layer and a width of each of the source electrode and the drain electrode in a channel width direction.

10. A semiconductor device comprising:
a first insulating layer over a wiring;
an oxide semiconductor layer over the first insulating layer;
a source electrode and a drain electrode over the oxide semiconductor layer;
a first barrier layer between the oxide semiconductor layer and one of the source electrode and the drain electrode;
a second barrier layer between the oxide semiconductor layer and the other of the source electrode and the drain electrode;

a gate insulating layer over the source electrode and the drain electrode; and a gate electrode over the gate insulating layer, wherein each of the first barrier layer and the second barrier layer comprises an oxide including indium, zinc and a first metal, wherein the oxide semiconductor layer comprises indium, zinc, and the first metal, wherein the first metal is one of aluminum, titanium, gallium, yttrium, zirconium, lanthanum, cerium, neodymium, and hafnium, wherein the first barrier layer is in contact with the wiring through an opening provided in the first insulating layer, and wherein an indium content of each of the first barrier layer and the second barrier layer is higher than an indium content of the oxide semiconductor layer.

11. The semiconductor device according to claim 10, wherein a shape of one of the first barrier layer and the second barrier layer and a shape of one of the source electrode and the drain electrode are substantially aligned with each other when seen from above.

12. The semiconductor device according to claim 10, wherein a content of the first metal of each of the first barrier layer and the second barrier layer is lower than or equal to the indium content of each of the first barrier layer and the second barrier layer.

13. The semiconductor device according to claim 10, wherein a width of the oxide semiconductor layer is smaller than a width of each of the first barrier layer and the second barrier layer and a width of each of the source electrode and the drain electrode in a channel width direction.

14. The semiconductor device according to claim 10, wherein a width of the oxide semiconductor layer is smaller than a width of each of the first barrier layer and the second barrier layer and a width of each of the source electrode and the drain electrode in a channel width direction.

15. A semiconductor device comprising:
a first insulating layer over a wiring;
an oxide semiconductor layer over the first insulating layer;
a source electrode and a drain electrode over the oxide semiconductor layer;
a first barrier layer between the oxide semiconductor layer and one of the source electrode and the drain electrode;
a second barrier layer between the oxide semiconductor layer and the other of the source electrode and the drain electrode;
a gate insulating layer over the source electrode and the drain electrode; and
a gate electrode over the gate insulating layer, wherein each of the first barrier layer and the second barrier layer comprises an oxide including indium, zinc and a first metal, wherein the oxide semiconductor layer comprises indium, zinc, and the first metal, wherein the first metal is one of aluminum, titanium, gallium, yttrium, zirconium, lanthanum, cerium, neodymium, and hafnium, and wherein the first barrier layer is in contact with the wiring through an opening provided in the first insulating layer.

16. The semiconductor device according to claim 15, further comprising a second gate electrode under the first insulating layer.

17. The semiconductor device according to claim 15, wherein a content of the first metal of each of the first barrier layer and the second barrier layer is lower than or equal to an indium content of each of the first barrier layer and the second barrier layer.

18. The semiconductor device according to claim 15,
wherein the first insulating layer comprises silicon oxide or silicon oxynitride, and
wherein the first insulating layer comprises oxygen at a higher proportion than a stoichiometric composition of the first insulating layer.

19. The semiconductor device according to claim 15, wherein each of the first barrier layer and the second barrier layer has a thickness greater than or equal to 3 nm and less than or equal to 100 nm.

20. The semiconductor device according to claim 15, wherein a shape of one of the first barrier layer and the second barrier layer and a shape of one of the source electrode and the drain electrode are substantially aligned with each other when seen from above.

21. The semiconductor device according to claim 15, wherein a width of the oxide semiconductor layer is smaller than a width of each of the first barrier layer and the second barrier layer and a width of each of the source electrode and the drain electrode in a channel width direction.

22. The semiconductor device according to claim 15, wherein the first barrier layer is in contact with a side surface of the opening and a top surface of the wiring.

23. The semiconductor device according to claim 15, wherein the one of the source and the drain electrode is provided inside the opening provided in the first insulating layer.

* * * * *